US008446513B2

(12) United States Patent
Aoki et al.

(10) Patent No.: US 8,446,513 B2
(45) Date of Patent: May 21, 2013

(54) IMAGING APPARATUS WITH LIGHT TRANSMISSIVE FILTER

(75) Inventors: Shin Aoki, Kanagawa (JP); Tetsuya Sasaki, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 298 days.

(21) Appl. No.: 12/911,033

(22) Filed: Oct. 25, 2010

(65) Prior Publication Data

US 2011/0096185 A1 Apr. 28, 2011

(30) Foreign Application Priority Data

Oct. 28, 2009 (JP) .................................. 2009-248135

(51) Int. Cl.
*H04N 5/225* (2006.01)

(52) U.S. Cl.
USPC ........................................ 348/342; 348/222.1

(58) Field of Classification Search
USPC .............................................. 348/222.1, 342
See application file for complete search history.

(56) References Cited

U.S. PATENT DOCUMENTS

| 6,628,327 | B1 | 9/2003 | Aoki et al. | |
|---|---|---|---|---|
| 7,595,826 | B2 | 9/2009 | Aoki et al. | |
| 7,742,640 | B1 * | 6/2010 | Carlson et al. | 382/173 |
| 2006/0283952 | A1 | 12/2006 | Wang | |
| 2007/0222781 | A1 | 9/2007 | Kondo et al. | |
| 2008/0186390 | A1 | 8/2008 | Sato et al. | |
| 2010/0194917 | A1 * | 8/2010 | Funamoto | 348/223.1 |
| 2011/0002040 | A1 * | 1/2011 | Aoki | 359/495 |

FOREIGN PATENT DOCUMENTS

| EP | 2034743 | * | 3/2009 |
|---|---|---|---|
| JP | 4295149 | | 7/2009 |

* cited by examiner

*Primary Examiner* — Gevell Selby
(74) *Attorney, Agent, or Firm* — IPUSA, PLLC

(57) ABSTRACT

An imaging apparatus includes a light receiving device array having light receiving devices, a light transmissive filter including plural types of band-shape light transmissive sections arranged in sequence to form a light transmissive section pattern, and an arithmetic processing unit, wherein the arithmetic processing unit includes a first parameter generating unit configured to generate a first parameter indicative of a displacement of the light transmissive section pattern relative to the light receiving device array in response to a position of one of the light receiving devices, a second parameter generating unit configured to generate second parameters in response to the first parameter generated by the first parameter generating unit, and an image generating unit configured to produce output images in response to image signals output from the light receiving devices and the second parameters generated by the second parameter generating unit.

6 Claims, 17 Drawing Sheets

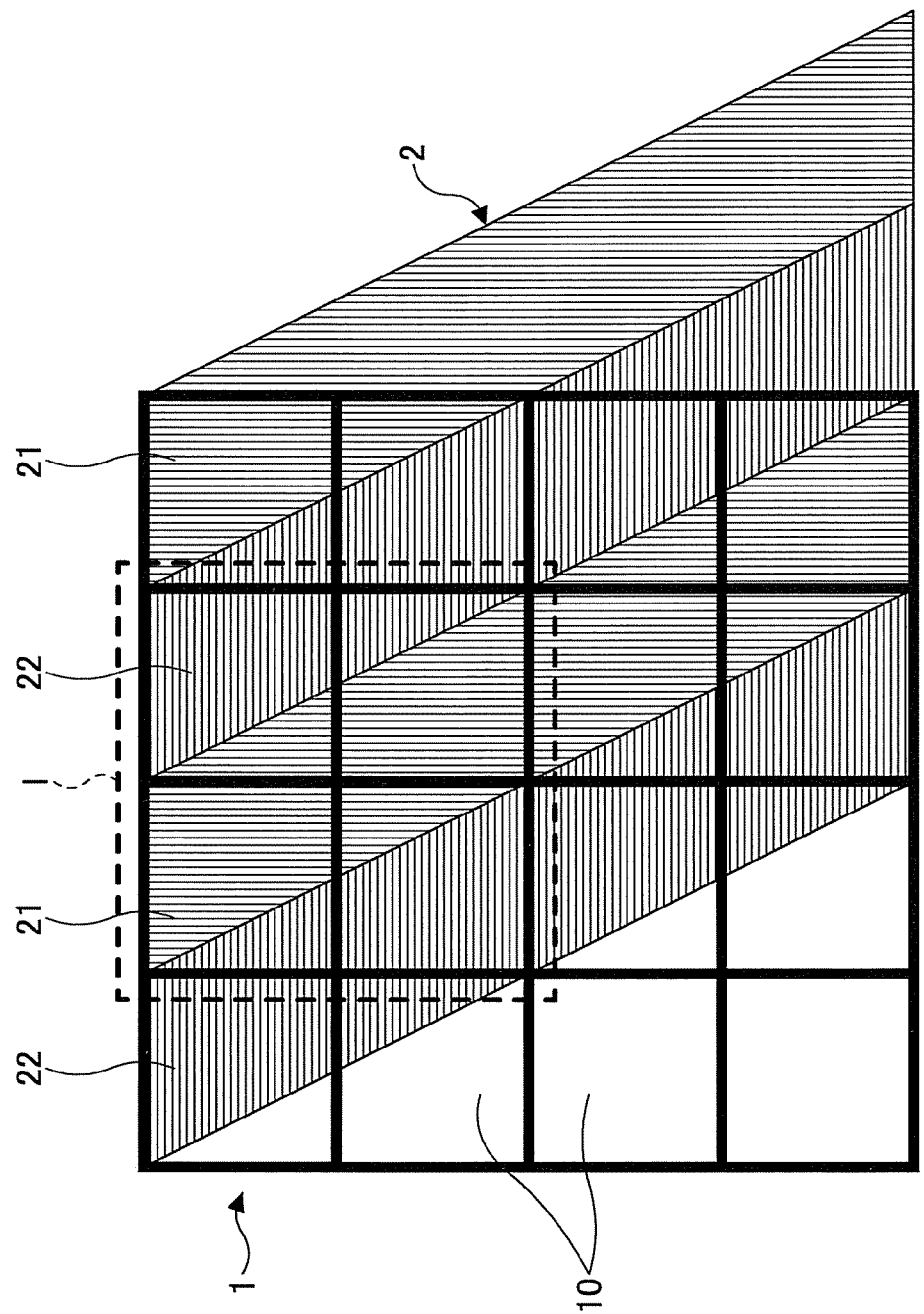

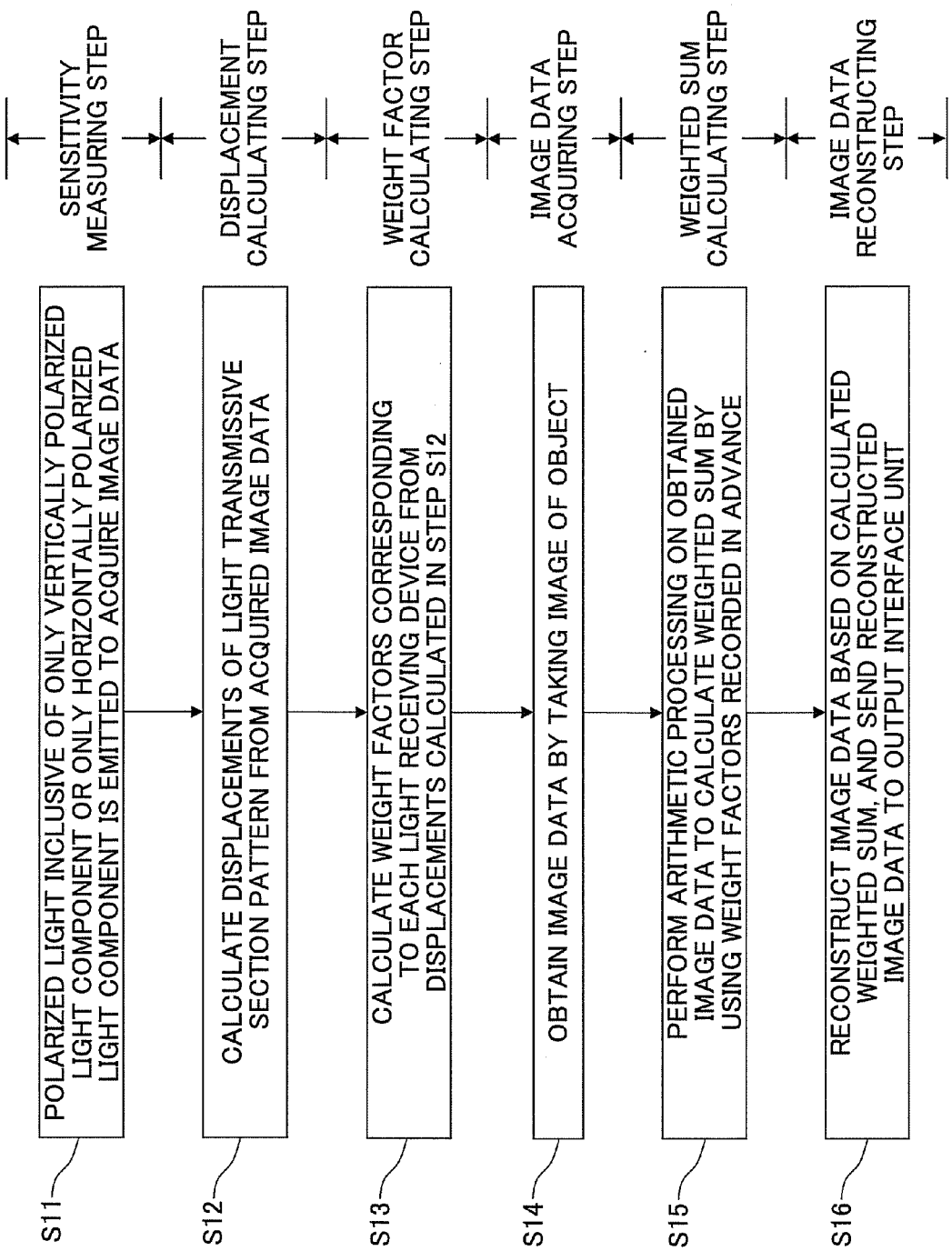

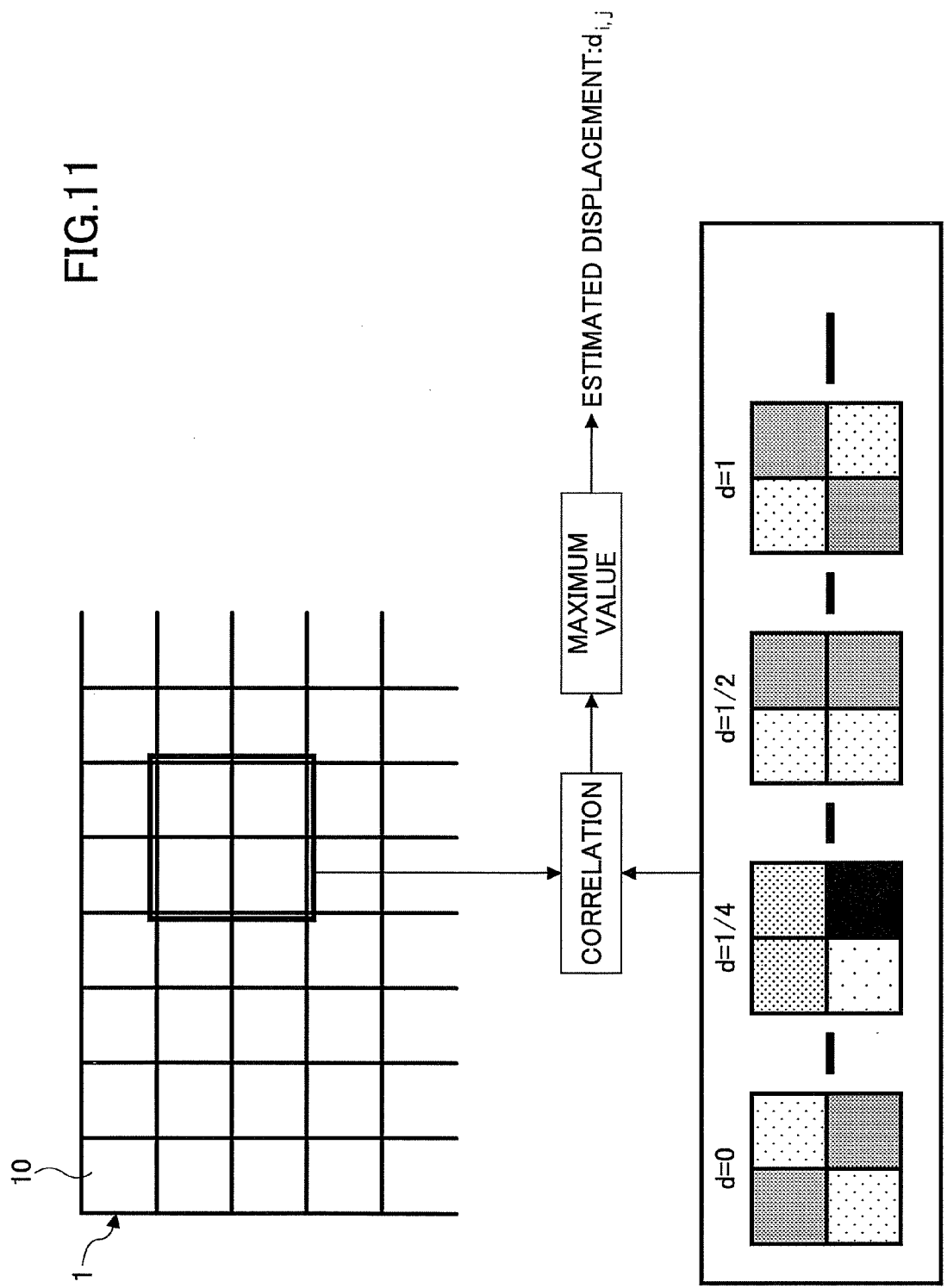

IMAGING APPARATUS WITH LIGHT TRANSMISSIVE FILTER

BACKGROUND OF THE INVENTION

1. Field of the Invention

The disclosures herein relate to an imaging apparatus that is provided with a light transmissive filter having a plurality of polarizing filters or color separation filters arranged therein, and that produces image signals by imaging an object.

2. Description of the Related Art

In digital cameras or the like, an imaging apparatus takes an image of an object to produce image signals, and may separate the image signals into image data of different wavelength bands. In other examples, an imaging apparatus takes an image of an object to produce image signals, and may separate the image signals into image data of different polarization components. This may be performed for the purpose of enhancing the contrast of the imaged object by removing unnecessary polarization components. Such imaging apparatuses may use a light receiving device array in which light receiving devices of the same type are arranged, and may separate incoming light into light components having different polarization directions or different wavelength bands.

For example, an area-divided-type filter that has its entire area divided into plural types, each allowing the passage of light having a different characteristic, may be disposed in front of a light receiving device array such as a CCD (Charge Coupled Device), a CMOS (Complementary Metal Oxide Semiconductor), or the like. In such imaging apparatuses, signal processing is performed with respect to image signal data output from the imaging device, so that a plurality of image signals are obtained as if light receiving devices of different types corresponding to light transmissive filters of respective, different characteristics were provided.

Further, for example, a polarizing filter may be disposed in front of a light receiving device array such as a CCD. This polarizing filter may be an area-divided polarizing filter that includes plural polarizing filters (hereinafter referred to as "polarizing filter sections") having different polarization directions disposed in a predetermined arrangement pattern. In such an imaging apparatus, a single image signal obtained by imaging an object is separated according to polarization directions to produce plural image signals.

In another example, a color filter may be disposed in front of a light receiving device array such as a CCD. This color filter may include spectral filters (hereinafter referred to as a "spectral filter sections") having different light transmission wavelength bands disposed in predetermined arrangement pattern as in the case of a color separation filter (i.e., area-divided spectral filter), in which areas are divided into R (red), G (green), and B (blue). In such an imaging apparatus, micro lenses may also be incorporated to produce color image signal data.

In the above-described imaging apparatus using micro lenses, a color filter, and a light receiving device array, a minute positional misalignment may occur with respect to a light incident angle, the filter position, and the micro lens position. Positional misalignment may create color shading, which refers to the phenomenon that light passing through a given filter is mixed with light passing through an adjacent filter. Matrix processing for removing mixed light may be performed a second time with respect to the data resulting from the conventional color-correction matrix processing, thereby correcting the mixing of light occurring in image signals obtained from the light receiving devices (i.e., pixels) of a light receiving device array (see Patent Document 1: Japanese Patent No. 4295149, for example).

Problems as follows are observed when image signals output from light receiving devices (i.e., pixels) of an light receiving device array are subjected to matrix processing in imaging apparatuses.

In Patent Document 1, the mixing of light caused by light passing through an adjacent filter is corrected in an imaging apparatus in which no positional misalignment is in existence between the filters and the light receiving device array. This correction is thus performed by matrix processing that uses coefficients obtained through a linear expression of coordinates of light receiving devices (i.e., pixels) after the conventional color correction matrix processing that is position-independent with respect to the light receiving device (i.e., pixels).

In the case of using an area-divided polarizing filter, a positional misalignment exceeding one pixel may occur. Under the presence of such a large misalignment, the sensitivity of light receiving devices (i.e., pixels) may become the same between pixels that are adjacent in a vertical direction or in a horizontal direction, depending on the positions of light receiving devices (i.e., pixels). Namely, weight factors for calculating a weighted sum in matrix processing may significantly differ depending on the positions of light receiving devices (i.e., pixels). Accordingly, correction cannot be made by using matrix processing that uses fixed parameters independent of the positions of light receiving devices (i.e., pixels).

Even in the case of using an area-divided polarizing filter, correction may be made by using parameters that vary depending on the positions of light receiving devices (i.e., pixels). Weight factors varying for each light receiving device (i.e., pixel) may be used, for example, to correct and reconstruct the image signals of light receiving devices (i.e., pixels) even when the positional accuracy of the area-divided filter is poor. Since parameters (i.e., weight factors) varying for each light receiving device (i.e., pixel) are used, however, there is a need for a large-size memory that can store all the parameters (i.e., weight factors).

Accordingly, it may be desirable to provide an imaging apparatus that reconstructs the image signals of light receiving devices through matrix processing, and that does not need to store all the factors of light receiving devices (i.e., pixels) in memory to perform as satisfactory a correction as when all these factors are stored.

SUMMARY OF THE INVENTION

It is a general object of at least one embodiment of the present invention to provide an imaging apparatus that substantially eliminates one or more problems caused by the limitations and disadvantages of the related art.

In one embodiment, an imaging apparatus includes a light receiving device array having light receiving devices two-dimensionally arranged in both a row direction and a column direction, a light transmissive filter disposed in front of the light receiving device array, the light transmissive filter including plural types of band-shape light transmissive sections having respective, different light transmissive characteristics, and the plural types of band-shape light transmissive sections being arranged in sequence in a direction parallel to neither the row direction nor the column direction of the light receiving device array to form a light transmissive section pattern, and an arithmetic processing unit configured to perform arithmetic processing on image data output from the light receiving devices, wherein the arithmetic processing unit includes a first parameter generating unit configured to generate a first parameter indicative of a displacement of the light transmissive section pattern relative to the light receiving device array in response to a position of one of the light receiving devices, a second parameter generating unit configured to generate second parameters in response to the first parameter generated by the first parameter generating unit, and an image generating unit configured to produce output images in response to image signals output from the light receiving devices and the second parameters generated by the second parameter generating unit.

BRIEF DESCRIPTION OF THE DRAWINGS

Other objects and further features of embodiments will be apparent from the following detailed description when read in conjunction with the accompanying drawings, in which:

FIG. 2 is a drawing illustrating an arrangement pattern of polarizing filter sections of an area-divided polarizing filter that is provided in the imaging apparatus according to the first embodiment;

FIG. 9 is a flowchart illustrating a signal processing method performed by the imaging apparatus according to the first embodiment;

FIG. 11 is an illustrative drawing illustrating calculation for estimating a displacement;

DESCRIPTION OF THE PREFERRED EMBODIMENTS

In the following, embodiments will be described by referring to the accompanying drawings.

First Embodiment

[Imaging Apparatus]

In the following, a description will be given of an imaging apparatus according to a first embodiment by referring to FIG. 1 through FIG. 6.

The imaging apparatus of the present embodiment takes an image of an object once by using a pair of a light receiving device array and an area-divided polarizing filter. The obtained image data is then used to produce the image data of vertically polarized light components and the image data of horizontally polarized light components.

Figure 1:
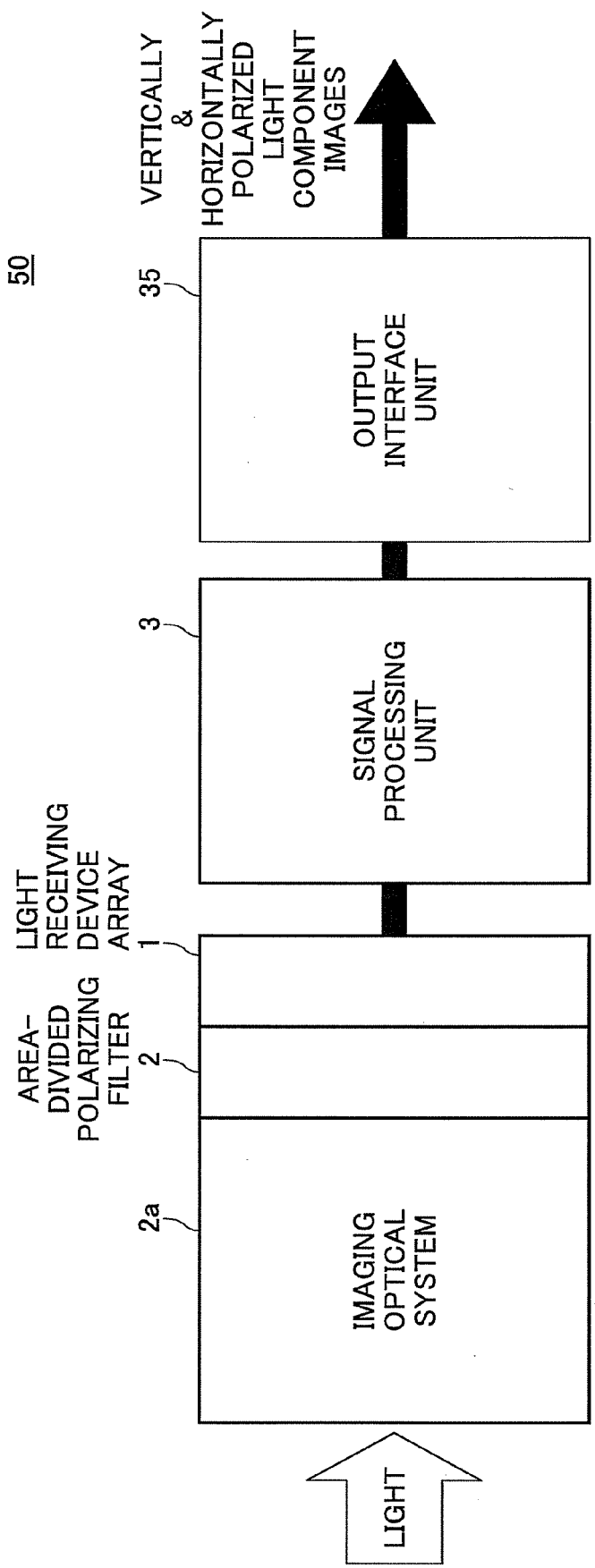
FIG. 1 is a block diagram schematically illustrating the entire configuration of an imaging apparatus according to a first embodiment.

A description will first be given of the entire configuration of the present embodiment by referring to FIG. 1. FIG. 1 is a block diagram schematically illustrating the entire configuration of the imaging apparatus according to the present embodiment.

As illustrated in FIG. 1, an imaging apparatus 50 of the present embodiment includes a light receiving device array 1 serving as an image sensor, an area-divided polarizing filter 2, an imaging optical system 2a, a signal processing unit 3, and an output interface unit 35. The imaging optical system 2a forms an image of a camera object on the light receiving device array 1 serving as an image sensor.

The area-divided polarizing filter 2 and the signal processing unit 3 serve as a light transmissive filter and an arithmetic processing unit, respectively.

The light receiving device array 1 serving as an imaging sensor has light receiving devices arranged two-dimensionally in rows and columns. A CCD, MOS, CMOS, or the like may be used as the light receiving device array 1. The area-divided polarizing filter 2 is situated in front of the light receiving device array 1 on an optical path through which the light receiving device array 1 receives light. The area-divided polarizing filter 2 may be closely attached to the surface of the light receiving device array 1. The area-divided polarizing filter 2 is a diagonal-stripe-type area-divided filter which will be described later. The signal processing unit 3 receives image data output from the light receiving device array 1, and produces image data that are equivalent to data obtained through respective, separate polarizing filters. Namely, the signal processing unit 3 performs signal processing on the image data output from the light receiving device array 1. The light receiving device array 1 may have an image resolution of 640×480 pixels, for example.

The image formed by the imaging optical system 2a passes through the area-divided polarizing filter 2 situated in front of the light receiving devices of the light receiving device array 1 to enter the light receiving devices of the light receiving device array 1. The image data output from the light receiving device array 1 is proportional to the intensity of light incident to the light receiving devices. This image data, as it is, is different from images of polarized light components (i.e., images each obtained by covering the entire face of the light receiving device array 1 with a light transmissive filter that passes a corresponding polarized light component). Signal processing is performed with respect to the image data output from the light receiving device array 1, thereby producing images of respective polarized light components.

[Area-Divided Polarizing Filter]

In the following, the area-divided polarizing filter of the imaging apparatus according to the present embodiment will be described by referring to FIG. 2. FIG. 2 is a drawing illustrating an arrangement pattern of the polarizing filter sections of the area-divided polarizing filter that is provided in the imaging apparatus according to the present embodiment. Polarizing filter sections of the present embodiment serve as light transmissive sections.

The area-divided polarizing filter 2 includes band-shape polarizing filter sections of different types that allow the selective passage of lights having respective, different polarization directions. Specifically, as illustrated in FIG. 2, the area-divided polarizing filter 2 includes polarizing filter sections 21 and 22 of different types that allow the selective passage of lights having different polarization directions that are at 90-degree angles relative to each other. The two types of diagonal bands illustrated in FIG. 2 are the two types of polarizing filter sections 21 and 22 that correspond to the vertical direction and the horizontal direction, respectively. The two types of polarizing filter sections 21 and 22 are arranged alternately (i.e., in sequence) in a width direction. In the present embodiment, the polarizing filter section 21 may be a vertical polarization filter section for which the polarization direction is vertical, and the polarizing filter section 22 may be a horizontal polarization filter section for which the polarization direction is horizontal.

In the example illustrated in the present embodiment, there are two types of polarizing filter sections. In such a case, the phrase "arranged in sequence" means that the two types A and B are arranged in the order as follows: A, B, A, B, A, B, and so on.

The area-divided polarizing filter is not limited to the configuration in which two types of polarizing filter sections for transmitting vertically polarized light and horizontally polarized light are provided. The area-divided polarizing filter may have three or more types of polarizing filter sections having different polarization directions. In the case in which there are three types of polarizing filter sections are provided, for example, the phrase "arranged in sequence" means that the three types A, B, and C are arranged in the order as follows: A, B, C, A, B, C, A, B, C, and so on.

In the case where there is no positional misalignment relative to the light receiving device array 1, the area-divided polarizing filter 2 is situated as illustrated in FIG. 2 to have a predetermined positional relationship as described below with light receiving devices 10 (or the light receiving sections of the light receiving devices 10), which are squares arranged in a matrix form.

Specifically, each of the vertical polarization filter section 21 and the horizontal polarization filter section 22 has a width that is equal to the width of one light receiving device (i.e., one pixel) in the horizontal direction in FIG. 2. Namely, the width of the vertical polarization filter section 21 and the width of the horizontal polarization filter section 22 as measured in the row direction in which the rows of the light receiving devices 10 extend are substantially equal to the width of one light receiving device 10 in the row direction. Further, each of the vertical polarization filter section 21 and the horizontal polarization filter section 22 has a width that is equal to the total width of two pixels in the vertical direction in FIG. 2. Namely, the width of the vertical polarization filter section 21 and the width of the horizontal polarization filter section 22 as measured in the column direction in which the columns of the light receiving devices 10 extend are substantially twice the width of one light receiving device 10 in the column direction. Accordingly, the border line between the adjacent polarizing filter sections of the area-divided polarizing filter has a slope equal to 2. In other words, the border line is diagonally positioned such that the border line crosses two light receiving devices (i.e., two pixels) in the vertical direction while it crosses one light receiving device (i.e., one pixel) in the horizontal direction.

Namely, the arrangement pattern in which the band-shape polarizing filter sections are arranged is a diagonal stripe pattern, and the width direction in which the band-shape polarizing filter sections are arranged is parallel to neither the horizontal direction (i.e., row direction) of the light receiving device array nor the vertical direction (i.e., column direction) of the light receiving device array.

In the present embodiment, the row direction and the column direction merely refer to the two arrangement directions of a two-dimensional array, respectively, and are interchangeable with each other. The configuration of the present embodiment thus includes an arrangement that is obtained through 90-degree rotation in which the column direction and the row direction are swapped with each other. Namely, the present embodiment includes a configuration that is obtained by replacing the horizontal direction (i.e., row direction) and the vertical direction (i.e., column direction) with the vertical direction (i.e., column direction) and the horizontal direction (i.e., row direction), respectively.

In the following, FIGS. 3A through 3D and FIG. 4 will be referred to in order to explain how the arrangement pattern of the polarizing filter sections of the area-divided polarizing filter according to the present embodiment is robust against the misalignment that occurs between the polarizing filter sections and the light receiving devices.

FIGS. 3A through 3D are drawings illustrating examples of misalignments in the horizontal direction (i.e., row direction) between the polarizing filter sections and the light receiving devices. FIG. 4 is a graph chart illustrating a cover rate that indicates the size of the overlapping area between a given polarizing filter section and a given light receiving device as a proportion of the area size of the given polarizing filter section with respect to various displacements in the horizontal direction (i.e., row direction). Specifically, FIG. 4 illustrates a cover rate between the vertical polarization filter section and a given light receiving device.

With "d" denoting a relative displacement between the polarizing filter sections and the light receiving devices, FIG. 3A, FIG. 3B, FIG. 3C, and FIG. 3D illustrate d being 0 pixel, d being ¼ pixels (0.25 pixels), d being ½ pixels (0.5 pixels), and d being ¾ pixels (0.75 pixels in the horizontal direction (i.e., row direction), respectively. In FIG. 3A, FIG. 3B, FIG. 3C, and FIG. 3D, for the sake of simplicity of illustration, four light receiving devices 11 through 14 arranged in two rows and two columns are illustrated with the vertical polarization filter section 21 and the horizontal polarization filter section 22 overlapping these light receiving devices 11 through 14.

Figure 3A:
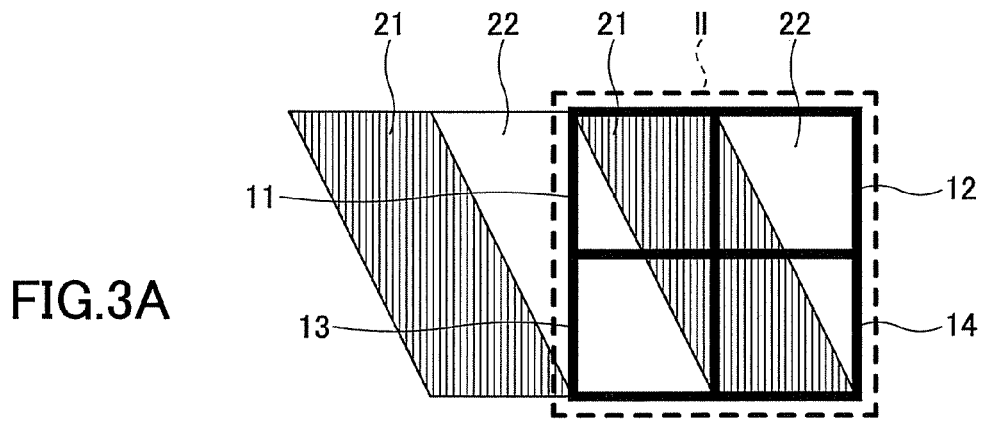
FIGS. 3A through 3D are drawings illustrating examples of misalignments in the horizontal direction (i.e., row direction) between the polarizing filter sections and the light receiving devices.

The area enclosed by dotted lines II in FIG. 3A corresponds to the area enclosed by dotted lines I in FIG. 2. Further, for the sake of providing an easily viewable illustration, the vertical polarization filter section 21 is shown in hatching whereas the horizontal polarization filter section 22 is not shown in hatching in FIGS. 3A through 3D.

In the following, a description will first be given of the cover rate that indicates the size of the overlapping area between the light receiving devices 14 and 12 and the vertical polarization filter section 21 in FIGS. 3A through 3D, where the light receiving devices 14 and 12 are taken as examples of the four light receiving devices 11 through 14.

Figure 3B:
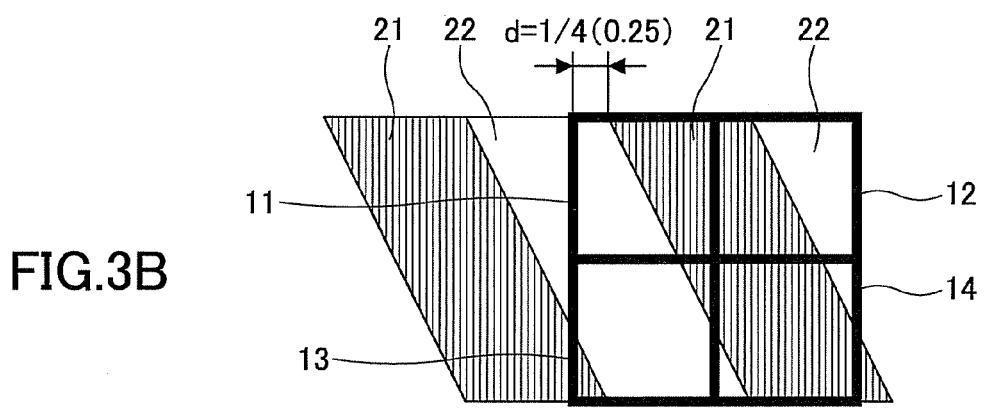
Figure 3C:
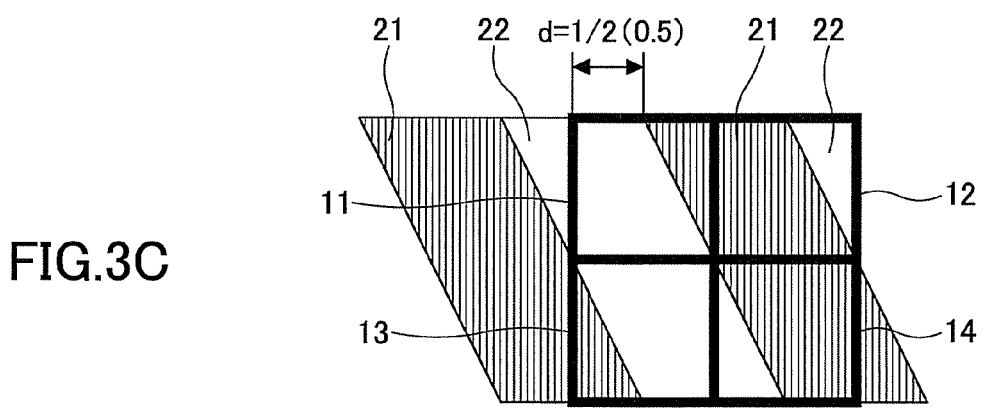
Figure 3D:
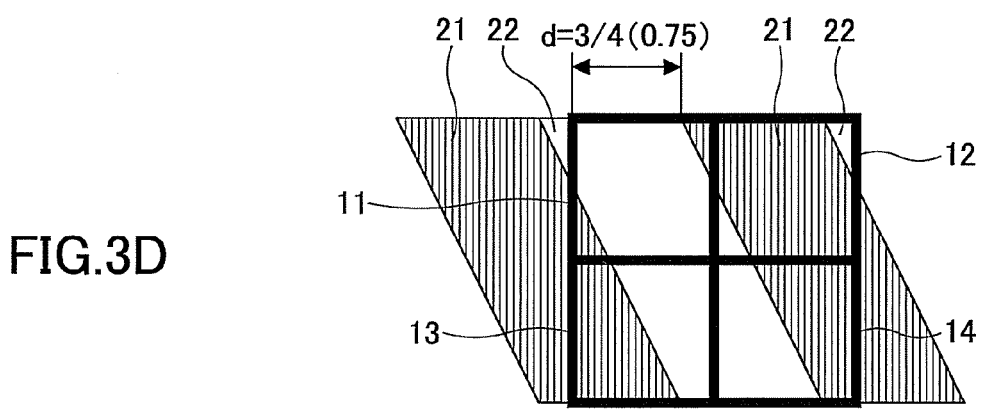
Figure 4:
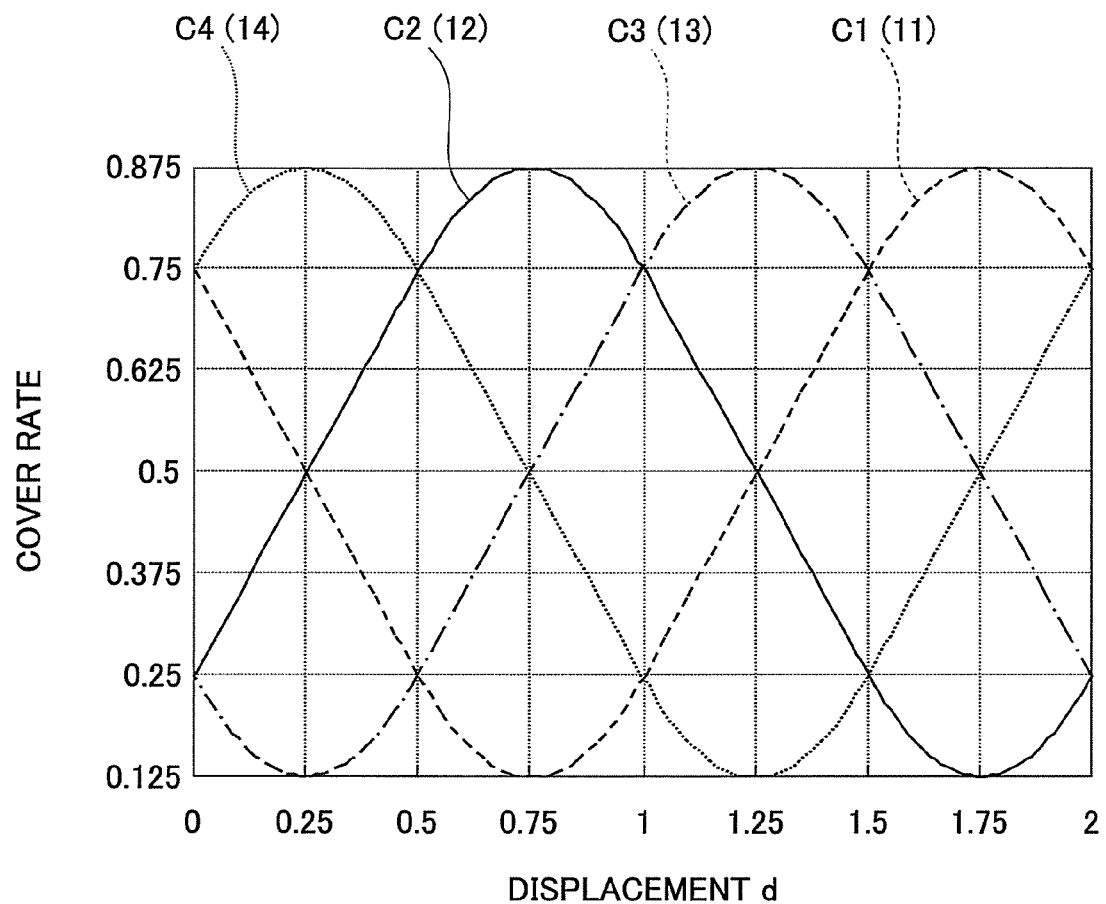
FIG. 4 is a graph chart illustrating a cover rate that indicates the size of the overlapping area between a given polarizing filter section and a given light receiving device as a proportion of the area size of the given polarizing filter section with respect to various displacements in the horizontal direction (i.e., row direction)

In the case of the displacement d between the polarizing filter sections and the light receiving devices being 0 as illustrated in FIG. 3A, the cover rates of the light receiving devices 14 and 12 with respect to the vertical polarization filter section 21 are 0.75 and 0.25, respectively. In the case of the displacement d between the polarizing filter sections and the light receiving devices being ¼ (0.25) as illustrated in FIG. 3B, the cover rates of the light receiving devices 14 and 12 with respect to the vertical polarization filter section 21 are 0.875 and 0.5, respectively. In the case of the displacement d between the polarizing filter sections and the light receiving devices being ½ (0.5) as illustrated in FIG. 3C, the cover rates of the light receiving devices 14 and 12 with respect to the vertical polarization filter section 21 are 0.75 and 0.75, respectively. In the case of the displacement d between the polarizing filter sections and the light receiving devices being ¾ (0.75) as illustrated in FIG. 3D, the cover rates of the light receiving devices 14 and 12 with respect to the vertical polarization filter section 21 are 0.5 and 0.875, respectively.

FIG. 4 illustrates changes in the cover rate with respect to continuous changes in the displacement d. In FIG. 4, the horizontal axis represents the displacement d in the horizontal direction (i.e., row direction) between the polarizing filter sections and the light receiving devices. One unit of the horizontal axis is equal to the width of one light receiving device in the horizontal direction (i.e., row direction). The vertical axis represents the cover rate of one light receiving device with respect to the vertical polarization filter section 21. In FIG. 4, a dashed-line curve C1, a solid-line curve C2, a chain-line curve C3, and a dotted-line curve C4 correspond to the light receiving devices 11, 12, 13, and 14 illustrated in FIG. 3A, respectively.

By referring to FIG. 4, a description will be given of the relationship between displacements and the cover rates of the vertical polarization filter section with respect to the light receiving devices 14 and 12 among the light receiving devices 11 through 14.

As illustrated in FIG. 4, the cover rate of the vertical polarization filter section 21 indicated by the curve C4 is in the range exceeding 0.75 with respect to the range of the displacement d being 0 to 0.5. Namely, 75% or more of the area of the light receiving device 14 is covered by the vertical polarization filter section 21. The curve C4 is downward sloping from left to right in the range of the displacement d being 0.5 to 1.0. Namely, the cover rate of the vertical polarization filter section 21 with respect to the light receiving device 14 decreases with an increase in the displacement d. The cover rate of the vertical polarization filter section 21 indicated by the curve C2 is in the range exceeding 0.75 with respect to the range of the displacement d being 0.5 to 1.0. Namely, 75% or more of the area of the light receiving device 12 is covered by the vertical polarization filter section 21. The curves C4 and C2 in the range of the displacement d being 1.0 to 2.0 have the shapes that are obtained by flipping the curves C4 and C2 in the range of the displacement d being 0 to 1.0 upside down with respect to a line of symmetry that is the horizontal line situated at a cover rate of 0.5. The portions of the light receiving devices 14 and 12 that are not covered by the vertical polarization filter section 21 are covered by the horizontal polarization filter section 22. Accordingly, the cover rate of the horizontal polarization filter section 22 is 75% or more in the range of the displacement d being 1.0 to 2.0.

The light receiving devices 14 and 12 are vertically adjacent to each other. When the light receiving device 12 on the upper side is covered half by the vertical polarization filter section 21 and half by the horizontal polarization filter section 22 (i.e., when the displacement d is 0.25), the light receiving device 14 on the lower side is mainly covered by the vertical polarization filter section 21. When the light receiving device 14 on the lower side is covered half by the vertical polarization filter section 21 and half by the horizontal polarization filter section 22 (i.e., when the displacement d is 0.75), the light receiving device on the upper side is mainly covered by the vertical polarization filter section 21. With respect to two light receiving devices that are horizontally adjacent to each other, the cover rate of the light receiving device on the right-hand side with respect to coverage by one polarizing filter section is the same as the cover rate of the light receiving device on the left-hand side with respect to coverage by the other polarizing filter section. In respect of a vicinity area comprised of the four pixels arranged in a 2-pixel-by-2-pixel matrix (i.e., in two rows and two columns), therefore, one of these four pixels is mainly covered (i.e., with a cover rate of 0.75 or more) by the vertical polarization filter section 21, and another pixel is mainly covered (i.e., with a cover rate of 0.75 or more) by the horizontal polarization filter section 22. This is true for any displacement d.

Figure 5:
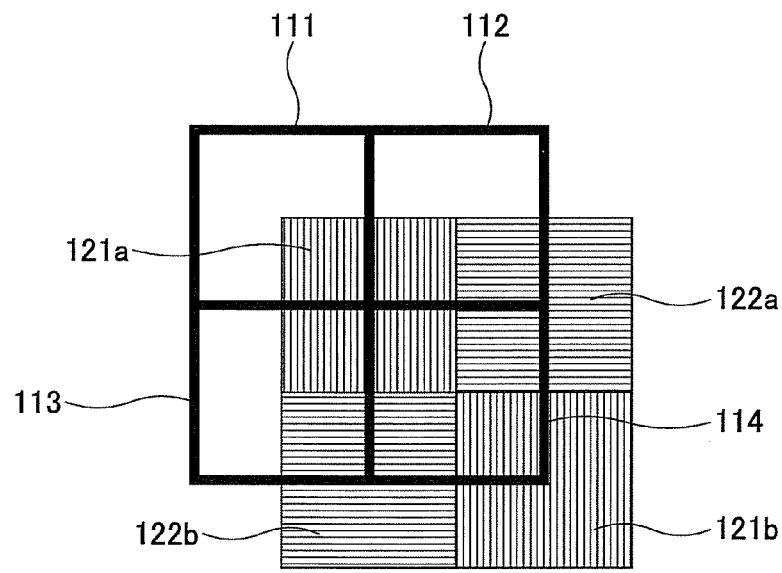
FIG. 5 is a drawing illustrating an example in which the arrangement pattern of an area-divided polarizing filter is a checker board pattern, and is displaced by ½ (0.5) in the horizontal direction (i.e., row direction) and in the vertical direction (i.e., column direction), respectively, relative to the light receiving devices.

Such an advantage described above is not obtained if the area-divided polarizing filter has other arrangement patterns. A checkerboard pattern will be compared with the present embodiment by referring to FIG. 5. FIG. 5 is a drawing illustrating an example in which the arrangement pattern of an area-divided polarizing filter is a checkerboard pattern, and is displaced by ½ (0.5) in the horizontal direction (i.e., row direction) and in the vertical direction (i.e., column direction), respectively, relative to the light receiving devices.

Each light receiving device may have a width of 6 micrometers in both the horizontal direction (i.e., row direction) and the vertical direction (i.e., column direction). The polarizing filter sections are then displaced relative to the light receiving devices by 3 micrometers (i.e., ½ pixels) in the horizontal direction and the vertical direction as illustrated in FIG. 5. In FIG. 5, four light receiving devices 111, 112, 113, and 114 and four polarizing filter sections are illustrated. The four polarizing filter sections include vertical polarization filter sections 121a and 121b and horizontal polarization filter sections 122a and 122b. In the illustrated state, light received by the light receiving device 114 ends up being an average of lights transmitting through the four polarizing filter sections 121a, 121b, 122a, and 122b. In such a case, the output of the light receiving device 114 stays constant regardless of the polarization direction of the incident light. No information about polarization can thus be obtained. The same relative positional relationships between the light receiving device array and the polarizing filter as described above repeatedly appear in the horizontal direction (i.e., row direction) and in the vertical direction (i.e., column direction). Accordingly, in all the light receiving devices, in addition to the light receiving device 114, the received light becomes an average of the lights passing through the four polarizing filter sections. No information about polarization can thus be obtained.

In contrast to what is described above, neither the cover rate by the vertical polarization filter section nor the cover rate by the horizontal polarization filter section becomes the same in all the four light receiving devices corresponding to the vicinity area comprised of a 2-pixel-by-2-pixel matrix according to the present embodiment. This is true regardless of the displacement d between the light receiving devices and the polarizing filter sections. When the polarization direction of incoming light changes, thus, the combination of four pixel outputs is bound to change. Information about polarization can thus be obtained.

The slope of a border line between adjacent polarizing filter sections relative to a border line between adjacent light receiving devices may be set to a value that is different from 2. When the slope is 2 and the width of the filter section in the horizontal direction is one pixel, however, the width of the filter section in the vertical direction becomes 2 pixels. This arrangement provides a repetition of the same arrangement in every two pixels in the vertical direction. Such an arrangement can thus help to use a narrow vicinity area, thereby to prevent effective resolution from being reduced. Also, such an arrangement can reduce the amount of computation performed by an arithmetic processing unit, which will be described later.

The above description has been provided with respect to a case in which the area-divided polarizing filter is displaced relative to the light receiving device array in the horizontal direction (i.e., row direction). The same principles also apply in the case of the area-divided polarizing filter being displaced relative to the light receiving device array in the vertical direction (i.e., column direction).

Further, rotational displacement by a small angle can be approximated by parallel displacement in the vicinity area. The same principles as those described above can thus apply.

[Signal Processing]

Figure 6:
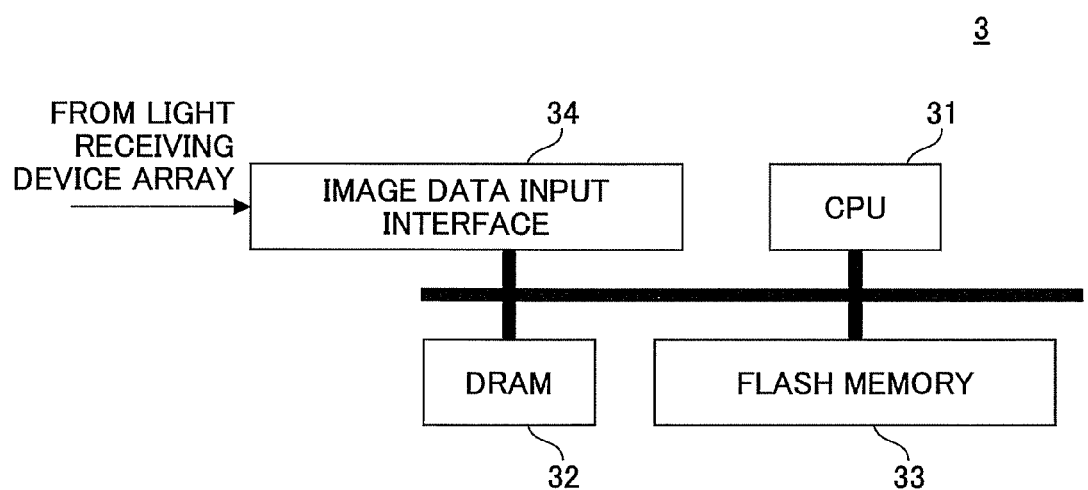
FIG. 6 is a block diagram illustrating the configuration of a signal processing unit of the imaging apparatus according to the first embodiment.
Figure 7:
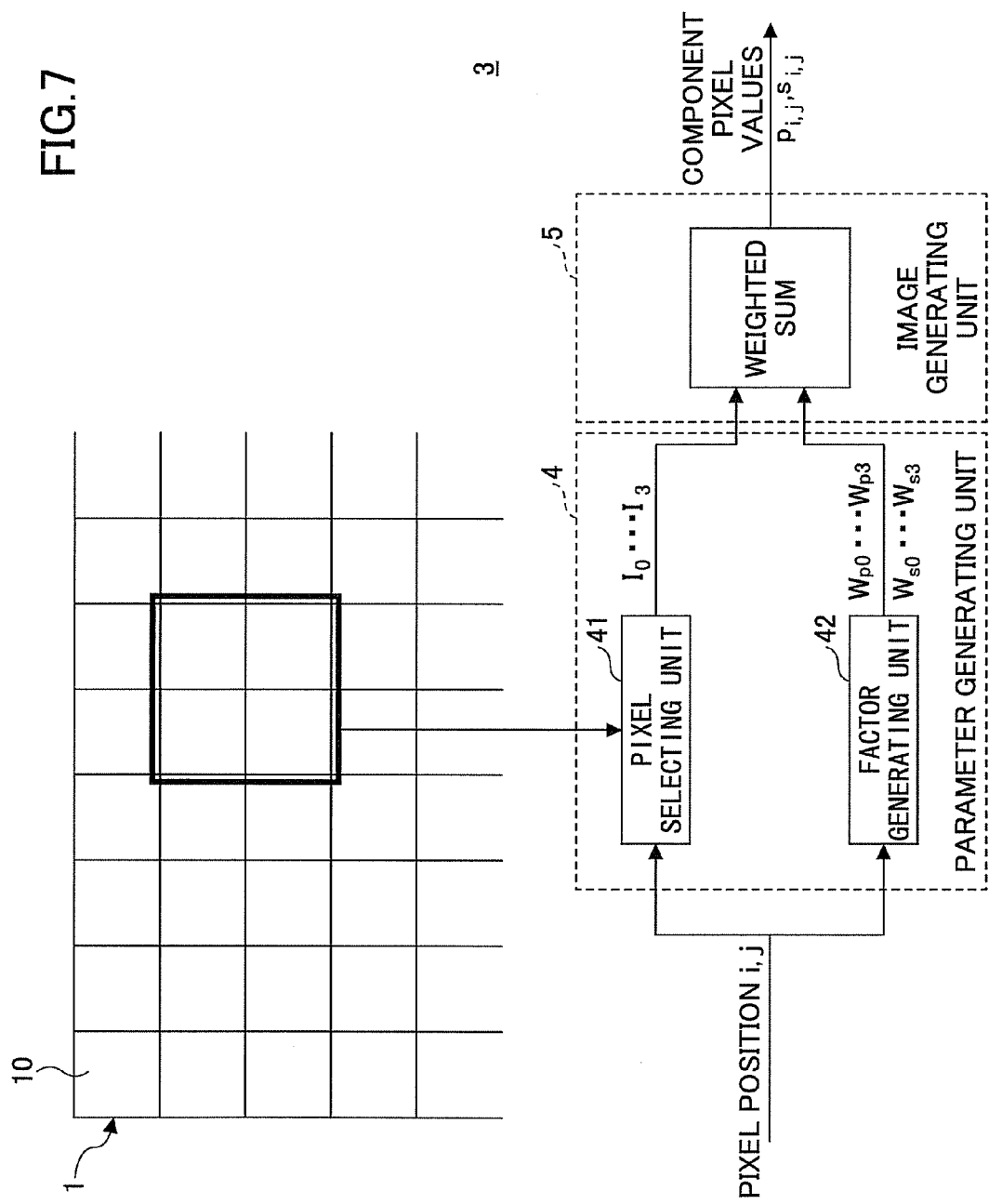
FIG. 7 is a block diagram illustrating the configuration of a signal processing unit of the imaging apparatus according to the first embodiment.
Figure 8:
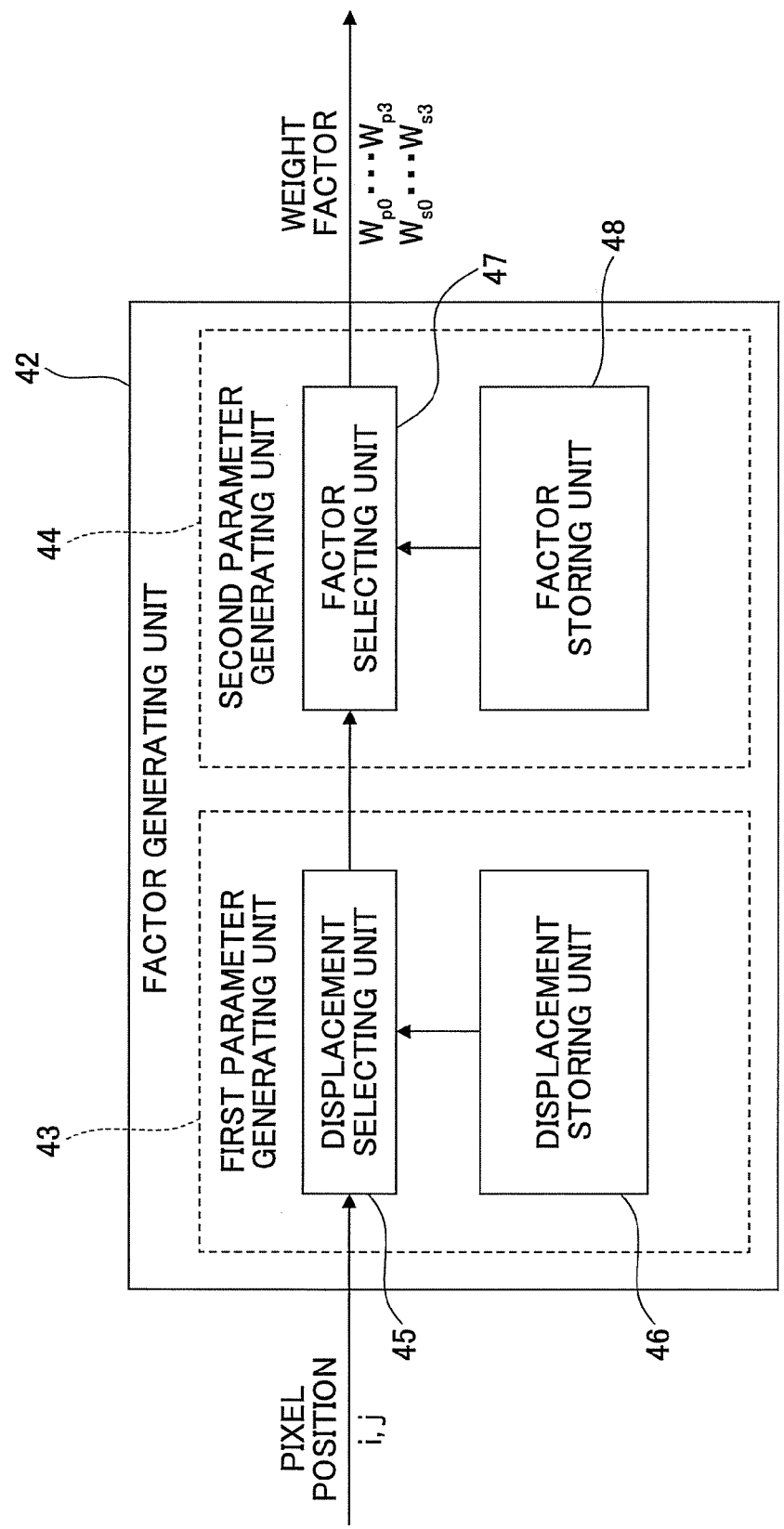
FIG. 8 is a block diagram illustrating the configuration of a first parameter generating unit of the signal processing unit illustrated in FIG. 7.

In the following, a description will be given of a signal processing method that reconstructs image data of each filter component from image data obtained by use of the above-described arrangement pattern by referring to FIGS. 6 through 8. FIGS. 6 and 7 are block diagrams illustrating the configuration of the signal processing unit of the imaging apparatus according to the present embodiment. FIG. 8 is a block diagram illustrating the configuration of a first parameter generating unit of the signal processing unit illustrated in FIG. 7.

As previously described, the arrangement pattern in which the band-shape polarizing filter sections are arranged is a diagonal stripe pattern. Namely, the arrangement pattern in which the band-shape polarizing filter sections are arranged is a diagonal stripe pattern, and the width direction in which the band-shape polarizing filter sections are arranged is parallel to neither the horizontal direction (i.e., row direction) of the light receiving device array nor the vertical direction (i.e., column direction) of the light receiving device array.

The use of such a diagonal-stripe arrangement pattern of polarizing filter sections prevents polarization information from being unobtainable when the polarizing filter is misaligned with the light receiving device array.

In the arrangement pattern of the polarizing filter sections having the diagonal stripe pattern, however, one polarizing filter section does not coincide with one light receiving device. Rather, a plurality of polarizing filter sections coincides with one light receiving device. Because of this, image data including only the light component passing through only one polarizing filter section cannot be obtained in a straight-forward manner.

In consideration of this, a signal processing method as will be described below is performed. This signal processing method reconstructs plural types of image data corresponding to respective types of polarizing filter sections from image data obtained by taking an image of an object by use of the diagonal stripe arrangement pattern in the area-divided polarizing filter. Specifically, a weighted sum is obtained by using predetermined weight factors responsive to the arrangement pattern of polarizing filter sections with respect to image signals output from a plurality of light receiving devices (i.e., pixels) situated in the vicinity of the light receiving device (i.e., pixel) of interest. As the result of computation, a vertically polarized light component or horizontally polarized light component (i.e., p-polarization component or s-polarization component) is obtained with respect to the above-noted light receiving device (i.e., pixel).

In the following, the p-polarization may mean vertical polarization, and the s-polarization may mean horizontal polarization.

As illustrated in FIG. 6, the signal processing unit 3 includes a CPU 31, a DRAM 32, a nonvolatile memory such as a flash memory 33, and an image data input interface 34. The signal processing unit 3 executes programs stored in the nonvolatile memory by use of the CPU 31 and the DRAM 32. With this provision, the signal processing unit 3 performs signal processing on the image data received from the light receiving device array 1 through the image data input interface 34. The resulting processed data is supplied to the output interface unit 35.

In this example, signal processing is performed by use of software running on the CPU 31. Such signal processing may alternatively be performed by a hardware-implemented arithmetic processing circuit.

As illustrated in FIG. 7, the signal processing unit 3 includes a parameter generating unit 4 and an image generating unit 5.

The parameter generating unit 4 includes a pixel selecting unit 41 and a factor generating unit 42. The pixel selecting unit 41 selects four light receiving devices (i.e., 2-×-2 pixels) that are adjacent to each other, and obtains respective image signals $I_0$, $I_1$, $I_2$, and $I_3$ of these light receiving devices (i.e., pixels). The factor generating unit 42 generates weight factors ($W_{p0}$, $W_{p1}$, $W_{p2}$, $W_{p3}$, $W_{s0}$, $W_{s1}$, $W_{s2}$, $W_{s3}$) used for generating image signals corresponding to the position (i, j) of a light receiving device (i.e., pixel). These weight factors are used for reconstructing output images from the image data output from the light receiving devices (i.e., pixels).

The image generating unit 5 receives the image signals output from a plurality of light receiving devices (i.e., pixels) and the weight factors output from the factor generating unit 42, and obtains a weighted sum of the image signals output from the plurality of light receiving devices (i.e., pixels) by use of the weight factors. In this manner, the image generating unit 5 generates $p_{i,j}$ and $s_{i,j}$, which are the pixel values of output image components.

As illustrated in FIG. 8, the factor generating unit 42 of the parameter generating unit 4 includes a first parameter generating unit 43 and a second parameter generating unit 44.

The first parameter generating unit 43 includes a displacement selecting unit 45 and a displacement storing unit 46. The first parameter generating unit 43 receives data indicative of the position of a light receiving device. The first parameter generating unit 43 generates a first parameter indicative of a displacement, in the vicinity of the light receiving device, between the arrangement pattern of the light receiving devices and the arrangement pattern of the polarizing filter sections. The displacement selecting unit 45 selects and retrieves a first parameter corresponding to the position of the specified light receiving device. The displacement storing unit 46 stores first parameters on a light-receiving-device-specific basis.

The second parameter generating unit 44 includes a factor selecting unit 47 and a factor storing unit 48. The second parameter generating unit 44 receives the first parameter output from the first parameter generating unit 43. The second parameter generating unit 44 generates second parameters that are weight factors used for generating image signals corresponding to the specified light receiving device from image signals output from a plurality of light receiving devices situated in the vicinity of the specified light receiving device.

The displacement selecting unit 45 and the displacement storing unit 46 may be referred to as a selecting unit and a memory unit, respectively, in the disclosures herein. The arrangement pattern of light receiving devices may be referred to as a light receiving device pattern in the disclosures herein. The arrangement pattern of polarizing filter sections may be referred to as a light transmissive section pattern in the disclosures herein. A displacement of the arrangement pattern of polarizing filter sections with respect to the arrangement pattern of light receiving devices corresponds to the position of the light transmissive section pattern relative to the light receiving device pattern.

In the following, the arrangement pattern of light receiving devices will be referred to as a light receiving device pattern for the purpose of clearly distinguishing between the arrangement pattern of light receiving devices and the arrangement pattern of polarizing filter sections. Further, the arrangement pattern of polarizing filter sections will be referred to as a light transmissive section pattern in the disclosures herein.

Figure 12:
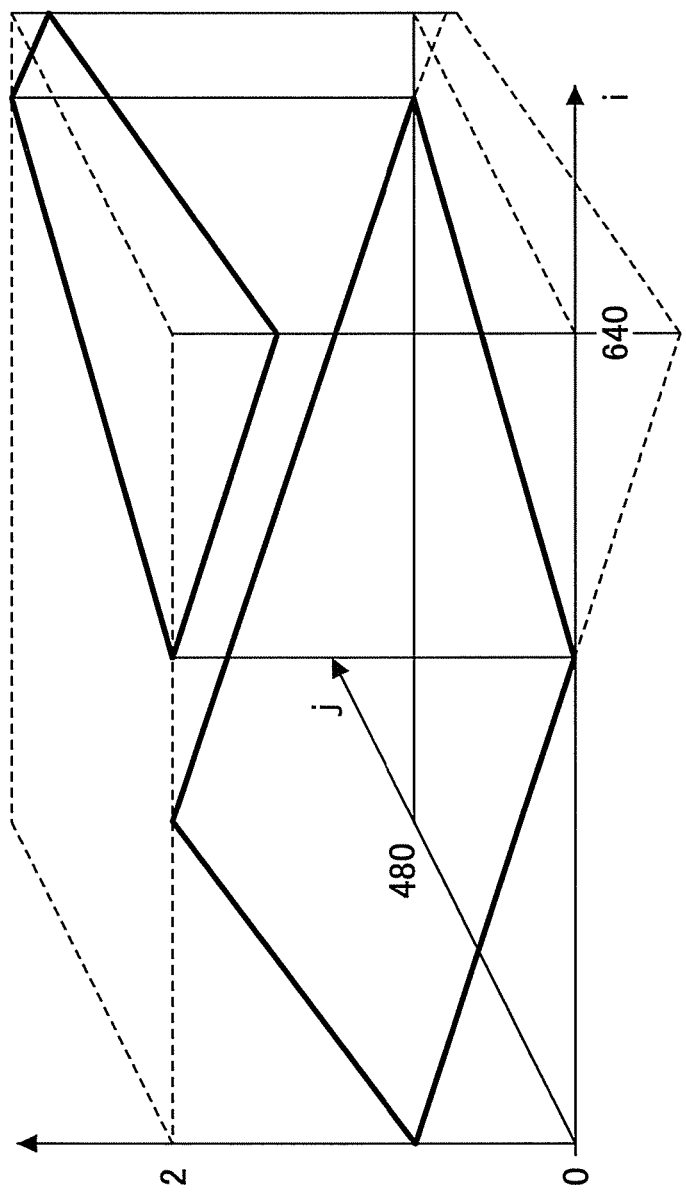
FIG. 12 is a drawing illustrating an example of displacement distribution on the screen of an imaging apparatus.
Figure 13:
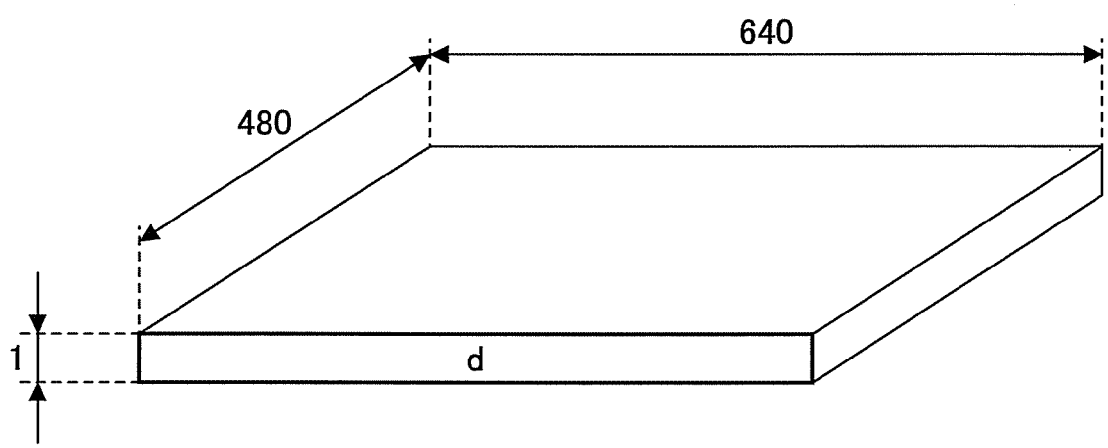
FIG. 13 is an illustrative drawing illustrating a memory capacity for storing displacements on a light-receiving-device-specific basis.
Figure 14:
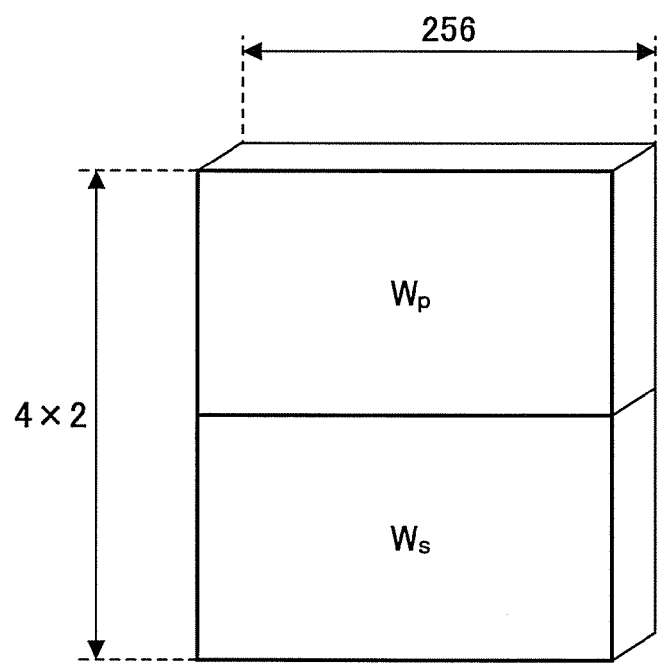
FIG. 14 is an illustrative drawing illustrating the storing of weight factors on a displacement-specific basis.

In the following, a description will be given of the signal processing method performed by the imaging apparatus according to the present embodiment by referring to FIG. 9 through FIG. 14. FIG. 9 is a flowchart illustrating the signal processing method performed by the imaging apparatus according to the present embodiment. FIGS. 10A through 10E are drawings illustrating changes in the displacement of a light transmissive section pattern relative to a light receiving device pattern. FIG. 11 is an illustrative drawing illustrating calculation for estimating a displacement. FIG. 12 is a drawing illustrating an example of displacement distribution on the screen of an imaging apparatus. FIG. 13 is an illustrative drawing illustrating a memory capacity for storing displacements on a light-receiving-device-specific basis. FIG. 14 is an illustrative drawing illustrating the storing of weight factors on a displacement-specific basis.

As illustrated in FIG. 9, the signal processing method of the present embodiment includes a sensitivity measuring step (step S11), a displacement calculating step (step S12), a weight factor calculating step (step S13), an image data acquiring step (step S14), a weighted sum calculating step (step S15), and an image data reconstructing step (step S16).

In the signal processing method of the present embodiment, step S11 through step S13 are performed in advance. Then, step S14 through step S16 are performed at the time of taking an image of an object.

As described above, the sensitivity measuring step (step S11) is performed in advance. In this step S11, polarized light (100% polarization) inclusive of only the vertically polarized light component or only the horizontally polarized light component is shone on the light receiving device array by a plane light or the like, and image data output from the light receiving device array is input into the signal processing unit.

The light receiving device array with the area-divided polarizing filter attached thereto is prepared in advance. Specifically, the area-divided polarizing filter may be attached to a face of the light receiving device array by an adhesive agent. The positioning, including angular alignment, of the polarizing filter sections of the area-divided polarizing filter relative to the light receiving devices of the light receiving device array does not have to be precise, and may suffice if approximate matching is achieved. The light receiving device array with the area-divided polarizing filter attached thereto is combined with the signal processing unit and the output interface unit to prepare the imaging apparatus of the present embodiment.

Light with the 100% vertically polarized light component having uniform intensity is then shone on the entire face of the light receiving device array. Output values of the light receiving devices of the light receiving device array are then recorded as reference image data RI1. Subsequently, light with the 100% horizontally polarized light component having uniform intensity is shone on the entire face of the light receiving device array. Output values are then recorded as reference image data RI2.

The values of the reference image data RI1 and RI2 with respect to a given light receiving device (i.e. pixel) are proportional to the sensitivities of this light receiving device (i.e., pixel) with respect to vertically polarized light and horizontally polarized light, respectively. The sensitivities for vertically polarized light and horizontally polarized light are mainly determined by the cover rates of this light receiving device (i.e., pixel) with respect to the vertical polarization filter section and the horizontal polarization filter section, respectively. These sensitivities do not vary after the area-divided polarizing filter is fixedly mounted to the light receiving device array.

When light is not incident from the normal direction to the surface of the area-divided polarizing filter and the light receiving device array, p-polarized light oscillating in the plane of incidence and s-polarized light oscillating perpendicular to the plane of incidence may be used in place of vertically polarized light and horizontally polarized light, respectively. Namely, p-polarized light or s-polarized light may be used to capture an image in step S11, thereby obtaining the reference image data RI1 and RI2, which are proportional to the sensitivities of each light receiving device (i.e., pixel) with respect to p-polarized light and s-polarized light, respectively.

The displacement calculating step (step S12) is then performed. In this step S12, the signal processing unit calculates the displacement of the light transmissive section pattern relative to the light receiving device pattern based on the acquired image data. Specifically, a correlation coefficient is calculated between the pattern of image data obtained from a plurality of light receiving devices (i.e., pixels) and the pattern of ideal image data obtained in advance with respect to various displacements. An estimate of the displacement is obtained by finding the ideal image data that has the largest correlation coefficient. Here, the displacement of the light transmissive section pattern relative to the light receiving device pattern refers to the position of the light transmissive section pattern relative to the light receiving device pattern.

In order to perform the calculation in step S12, the ideal image data are calculated in advance with respect to various displacements. FIGS. 10A through 10E illustrate positional relationships between the light receiving device pattern and the light transmissive section pattern for various displacements.

In FIGS. 10A to 10E, similarly to FIGS. 3A to 3E, the light receiving device pattern includes the four light receiving devices 11 through 14 arranged in two rows and two columns, and the light transmissive section pattern includes the two types of band-shape polarization filter sections 21 and 22. The vertical polarization filter section 21 is illustrated in vertical hatching.

Figure 10A:
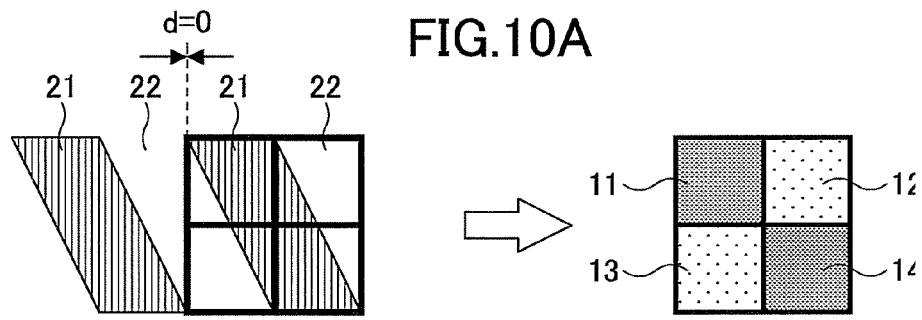
FIGS. 10A through 10E are drawings illustrating changes in the displacement of a light transmissive section pattern relative to a light receiving device pattern.
Figure 10B:
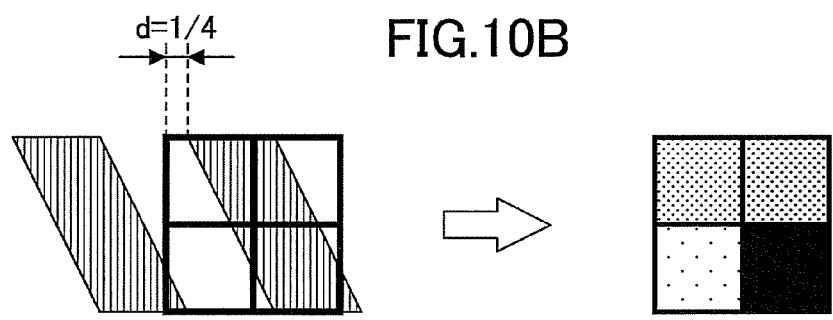
Figure 10C:
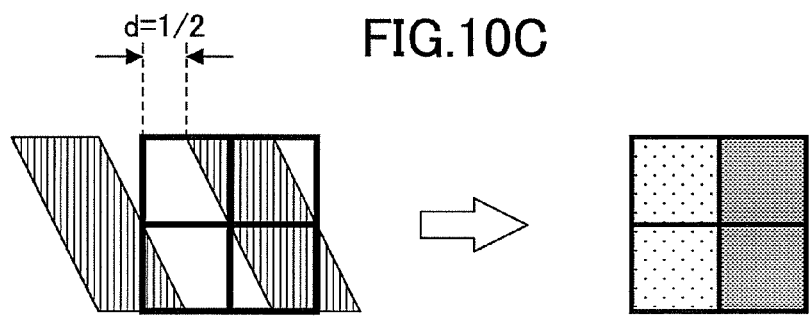
Figure 10D:
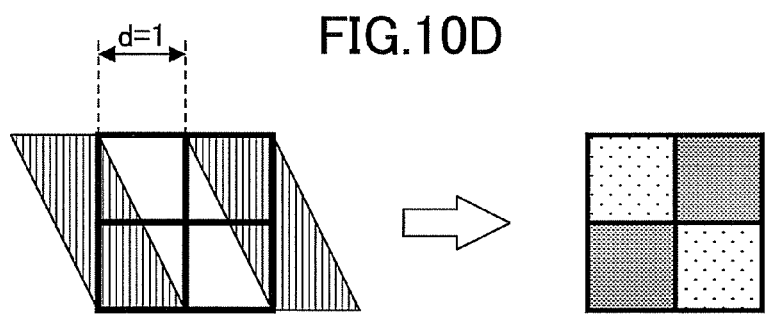
Figure 10E:
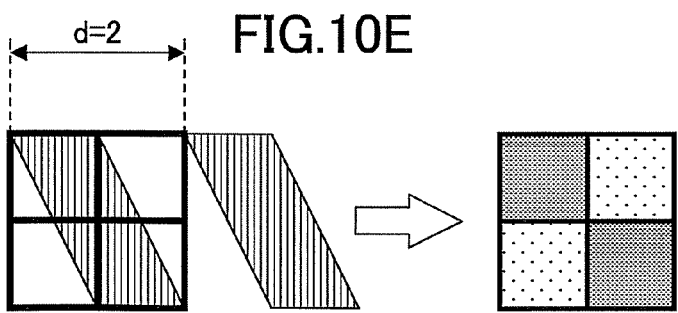

FIG. 10A illustrates the case in which the displacement d is 0. In this case, 75% of the top-left light receiving device 11 is covered by the polarization filter section 21 (illustrated in vertical hatching), and 25% of the top-left light receiving device 11 is covered by the polarization filter section 22 (illustrated with no hatching). One hundred percent of vertically polarized light may pass through the polarization filter section 21, and one hundred percent of horizontally polarized light may pass through the polarization filter section 22. In such a case, 25% of vertically polarized light passes through the light receiving device 11, so that the sensitivity of this light receiving device (i.e., pixel) with respect to vertically polarized light is 25%. In this manner, ideal sensitivity with respect to each polarized light component can be estimated based on the cover rates of the polarization filter sections 21 and 22 at each light receiving device (i.e., pixel).

FIG. 10B, FIG. 10C, FIG. 10D, and FIG. 10E illustrate the cases of the displacement d being ¼, ½, 1, and 2, respectively. The pattern of image data with respect to the light receiving devices may be calculated from the cover rates of the polarization filter sections 21 and 22 as illustrated on the right-hand side of these figures. Such a pattern will be referred to as an ideal sensitivity pattern.

After obtaining the ideal sensitivity patterns as described above, a correlation coefficient between the ideal sensitivity patterns and the pattern of image data at each light receiving device (i.e., pixel) is calculated, thereby identifying the ideal sensitivity pattern having the largest correlation coefficient. In this manner, an estimate of the displacement d is obtained at the position of each light receiving device (i.e., pixel).

FIG. 12 illustrates the distribution of estimated displacements. Slanted planes defined by thick solid lines in FIG. 12 represent displacement $d_{i,j}$ at each pixel position (i, j) of a 640-×-480-pixel image sensor. Two separate planes are shown in FIG. 12 because the displacement is represented in the range of 0 to 2. If negative values are also used to represent the displacement, these two planes form a single continuous plane as illustrated by thick dotted lines in FIG. 12. Flat planes or curved surfaces may be used for the purpose of approximation in order to reduce errors in the estimated displacements.

The area-divided filter may be in a rotated position, or may have a fluctuation in the pitch that is the width of each light transmissive section in the vertical direction or horizontal direction. In such a case, the distribution of displacements $d_{i,j}$ becomes a flat plane as illustrated in FIG. 12. The distribution of displacements $d_{i,j}$ may form a curved surface due to distortion of the filter, the orientation of incident light deviating from the normal direction, or the like. In any case, the displacement $d_{i,j}$ tends to exhibit only a small change between neighboring light receiving devices (i.e., pixels) while it tends to exhibit a noticeable change over the entirety of the light receiving device array (i.e., the entirety of the screen). In other words, the distribution of displacements $d_{i,j}$ forms a smooth sloped face.

In the present embodiment, displacements $d_{i,j}$ obtained and recorded (i.e., stored in memory) correspond in number to the number of light receiving devices (i.e., pixels). The number of light receiving devices (i.e., pixels) of the light receiving device array may be 640×480, for example. If the displacement $d_{i,j}$ is represented in units of 1/256 pixels (i.e., 8 bits) for each light receiving device (i.e., pixel), the required memory capacity may be 640×480×1=307200 bytes as illustrated in FIG. 13.

As was previously described, an estimate of displacement $d_{i,j}$ is obtained by finding an ideal sensitivity pattern having the largest correlation coefficient in comparison with the pattern of image data among the ideal sensitivity patterns that have been calculated in advance for various displacements. When the ideal sensitivity patterns are calculated in advance at desired intervals such as in increments of 1/256 pixels, the displacement is obtained with accuracy corresponding to the 1/256 pixel unit. In this manner, the first parameter for representing a displacement may have sub-pixel accuracy.

The relationship between the displacement and the cover rate significantly changes with a change of the displacement by one pixel as illustrated in FIG. 4. Weight factors obtained from the displacement in the next step (i.e., step S12) also change in response to the cover rate (i.e., area cover rate), so that these factors also significantly change with a change of the displacement by one pixel. It is thus desirable to obtain a displacement in step S12 with an accuracy finer than the pixel size.

The weight factor calculating step (step S13) is then performed. In this step S13, weight factors corresponding to each light receiving device are calculated based on the displacements obtained in step S12, and are recorded (i.e., stored) in the memory unit. The calculation of the weight factors is performed by using formula (5), which will be described later. The memory unit for storing the weight factors may be a nonvolatile memory such as the flash memory 33.

The displacement is quantized, and an appropriate number of weight factors are stored in the memory unit on a displacement-specific basis. As illustrated in FIG. 14, two pixels of one cycle are divided by 256, and 4-×-2 factors are stored for each step corresponding to 1/128 pixel. In the example illustrated in FIG. 14, each weight factor is assumed to be 1-byte data. The data amount may properly be changed in response to accuracy required for output images, noise characteristics of the image sensor used, etc.

The weight factors stored in the memory unit are determined with respect to each ideal sensitivity pattern by calculating in advance a pseudo-inverse matrix by use of formula (5) as will be described later. In this case, an ideal sensitivity pattern may preferably be determined by taking into account the transmissivity of actually-used polarization filters and the effect of encroachment at the area boundaries.

After step S11 through step S13 are performed in advance as described above to calculate and store the weight factors, step S14 through step S17 are performed at the time of taking an image of an object.

First, the image data acquiring step (step S14) is performed. In this step S14, an image of an object is taken to produce image data.

Next, the weighted sum calculating step (step S15) is performed. In this step S15, arithmetic processing is performed to obtain a weighted sum from the acquired image data by using the stored weight factors.

The vertically polarized light component of incident light is denoted as $L_v$, the horizontally polarized light component denoted as $L_h$, the sensitivity of the vertically polarized light component of a light receiving device i denoted $a_{v,i}$, and the sensitivity of the horizontally polarized light component denoted as $a_{h,i}$. Intensity $I_i$ of incident light entering the light receiving device i through the area-divided polarizing filter is represented as follows.

$$I_i = a_{vi}L_v + a_{hi}L_h \quad (1)$$

Assuming that the same light enters the adjacent light receiving devices arranged in two rows and two columns, the above equation (1) is satisfied with respect to all of these four light receiving devices I1 through I4. The following equation is thus obtained.

$$\begin{bmatrix} I_{11} \\ I_{12} \\ I_{13} \\ I_{14} \end{bmatrix} = \begin{bmatrix} a_{v11} & a_{h11} \\ a_{v12} & a_{h12} \\ a_{v13} & a_{h13} \\ a_{v14} & a_{h14} \end{bmatrix} \begin{bmatrix} L_v \\ L_h \end{bmatrix} \quad (2)$$

The left-hand side of the equation (2) is denoted as I, and the two matrices on the right-hand side of the equation (2) are denoted as M and L, respectively, in the order in which they appear. Then, the equation (2) is represented as equation (3) as shown below.

$$I = ML \quad (3)$$

The intensity $I_i$ of incident light is determined from the image data output from the light receiving device array. The sensitivities $a_{vi}$ and $a_{hi}$ of vertically and horizontally polarized light components of the light receiving device i are known from the data measured in step S11. Only the polarized light components $L_v$ and $L_h$ of the incident light are unknown.

The equation (3) represents simultaneous linear equations in which the number of constraint conditions is larger than the number of unknown values $L_v$ and $L_h$. Such a problem is solved by applying a pseudo inverse matrix $M^+$ of the matrix M to the equation (3) as follows.

$$L = M^+ I \quad (4)$$

Here, $M^+$ is represented as follows.

$$M^+ = (M^T M)^{-1} M^T \quad (5)$$

Depending on the displacement between the polarizing filter sections and the light receiving devices, there are cases in which information about polarization is rather difficult to obtain. Such cases occur when the cover rates of adjacent pixels by a filter section are close to 50% in the pixel area comprised of pixels arranged in two rows and two columns. The use of the arithmetic processing method of the present embodiment, however, allows the solutions for $L_v$ and $L_h$ to be obtained in such a manner as to minimize errors through the use of a pseudo inverse matrix.

As previously described, the matrix $M^+$ that represents weight factors corresponding to each light receiving device is calculated by using the equation (5) in step S13, and the calculated matrix $M^+$ is stored in memory. After this preparation, in step S15, a weighted sum of the image data $I=(I_{11}, I_{12}, I_{13}, I_{14})$ is calculated with respect to the light receiving devices arranged in two rows and two columns, thereby obtaining the vertically and horizontally polarized light components $L=(L_v, L_h)$ of each light receiving device.

The calculation of the equation (5) is rather complicated. However, it suffices to perform the calculation of the equation (5) only once prior to an actual imaging operation. Namely, it suffices to perform the calculation only once at the time of manufacturing the camera by using a computer separate from the camera to store the results of calculation in memory. The complexity of the calculation thus does not affect the processing speed at the time of taking an image.

Lastly, the image data reconstructing step (step S16) is performed. In this step S16, image data is reconstructed from the obtained weighted sum, followed by sending the reconstructed image data to the output interface unit.

Figure 15:
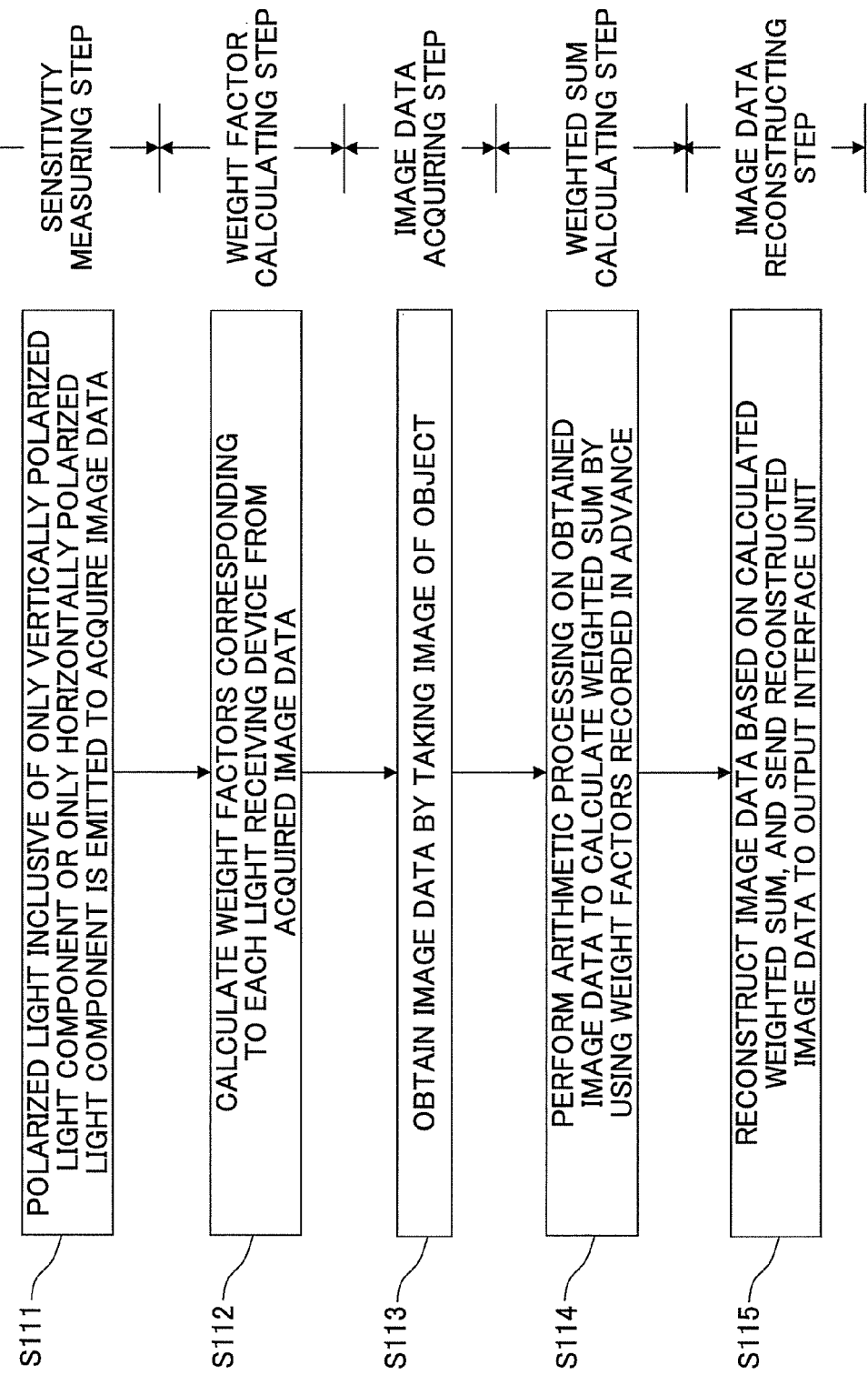
FIG. 15 is a flowchart illustrating a signal processing method performed by the imaging apparatus of a comparative example.
Figure 16:
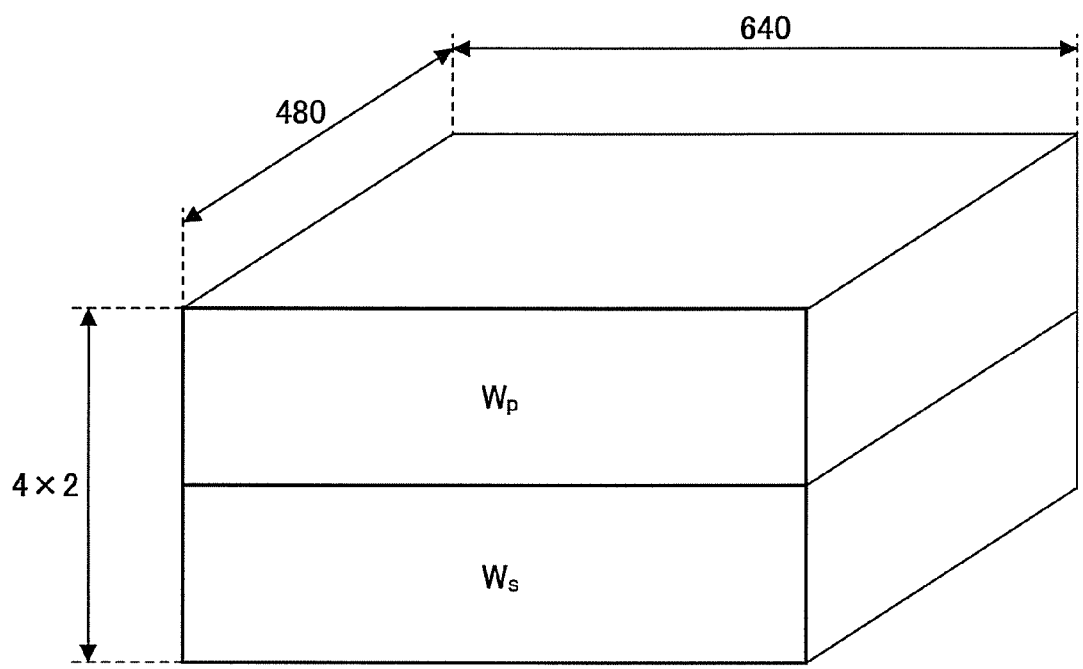
FIG. 16 is an illustrative drawing illustrating a memory capacity for storing displacements on a light-receiving-device-specific basis in the comparative example.

In the following, the present embodiment will be compared with a comparative example by referring to FIG. 15 and FIG. 16. Through this comparison, an explanation will be given of an advantage of the imaging apparatus of the present embodiment that does not need to store all the factors of light receiving devices (i.e., pixels) and yet can perform as satisfactory correction as in the case of all these factors being stored. FIG. 15 is a flowchart illustrating the signal processing method performed by the imaging apparatus of the comparative example. FIG. 16 is an illustrative drawing illustrating a memory capacity for storing displacements on a light-receiving-device-specific basis in the comparative example.

In respect of the comparative example, a description will be given below of a case in which all the weight factors are calculated and stored in memory for each light receiving device.

As illustrated in FIG. 15, the signal processing method of the comparative example includes a sensitivity measuring step (step S111), a weight factor calculating step (step S112), an image data acquiring step (step S113), a weighted sum calculating step (step S114), and an image data reconstructing step (step S115). Namely, the parameter generation that calculates weight factors based on pixel positions is performed only in the weight factor calculating step (step S112).

An image sensor having 640-×-480 pixels is used as in the case of the present embodiment. Further, a weighted sum of four pixels (i.e., 2-×-2 pixels) is calculated to reconstruct a vertically polarized light component (or p-polarized light component) and a horizontally polarized light component (or s-polarized light component). In such a case, a memory unit having a storage capacity of 2457600 bytes (=640×480×4×2) is needed as illustrated in FIG. 16.

In the signal processing method of the present embodiment, on the other hand, the parameter generation that calculates weight factors based on pixel positions is performed in two stages, i.e., first in the displacement calculating step (step S12) for estimating a displacement in pixel positions, and next in the weight factor calculating step (step S13) for calculating weight factors based on the estimated displacements. The displacement calculating step (step S12) and the weight factor calculating step (step S13) correspond to the first parameter generating unit and the second parameter generating unit, respectively, of the signal processing unit.

The values of weight factors vary depending on the positions (i.e., coordinates) of light receiving devices (i.e., pixels). However, the values of weight factors are not directly determined by coordinates. These values are determined by the position of the light transmissive section pattern relative to the light receiving device pattern in the vicinity of the light receiving device (i.e., pixel) of interest, i.e., determined by the p-&-s sensitivity patterns of the four neighboring light receiving devices. This position of the light transmissive section pattern relative to the light receiving device pattern varies depending on the position of the light receiving device (i.e., pixel) of interest. As a result, the values of weight factors vary indirectly in response to the position (i.e., coordinates) of the light receiving device (i.e., pixel) of interest. Accordingly, the substantially same parameter generation as that of the comparative example is attainable by the two-stage conversion, which includes the first conversion from the coordinates of a light receiving device (i.e., pixel) to the relative position of the light transmissive section pattern and the second conversion from the relative position of the light transmissive section pattern to weight factors.

The storage capacity of the memory unit for performing the two-stage process is far smaller than the storage capacity of the memory unit required in the comparative example. In the above-noted example, the memory volume required for the factor generating unit of the present embodiment is 309248 bytes (=640×480×1+256×4×2), which is about 13% of the memory volume (640×480×4×2=2457600 bytes) required in the comparative example illustrated in FIG. 16.

The imaging apparatus of the present embodiment described above utilizes the fact that weight factors remain unchanged when the position of the light transmissive section pattern relative to the light receiving device pattern is the same. Accordingly, the present embodiment which does not store the factors of all the light receiving devices (i.e., pixels) can still produce as satisfactory results as in the case in which the factors of all the light receiving devices are stored. When the distribution of displacements $d_{i,j}$ forms a flat plane over the positions of light receiving devices (i.e., pixels), it suffices to store only one-dimensional displacement with respect to each light receiving device (i.e., pixel). In this case, a yet smaller storage capacity is sufficient to store all the displacements for all the light receiving devices (i.e., pixels).

Furthermore, the present embodiment employs an area-divided polarizing filter that has two types of polarizing filter sections, i.e., the vertical polarization filter section and the horizontal polarization filter section, which are arranged alternately. Notwithstanding this example, the polarizing filter sections are not limited to these two types corresponding to the vertical and horizontal polarizations, but may have a configuration in which three or more polarizing filter sections having three or more different polarization directions are arranged in sequence in a repeated manner.

Second Embodiment

In the following, a description will be given of an imaging apparatus according to a second embodiment by referring to FIG. 17 and FIG. 18.

Figure 17:
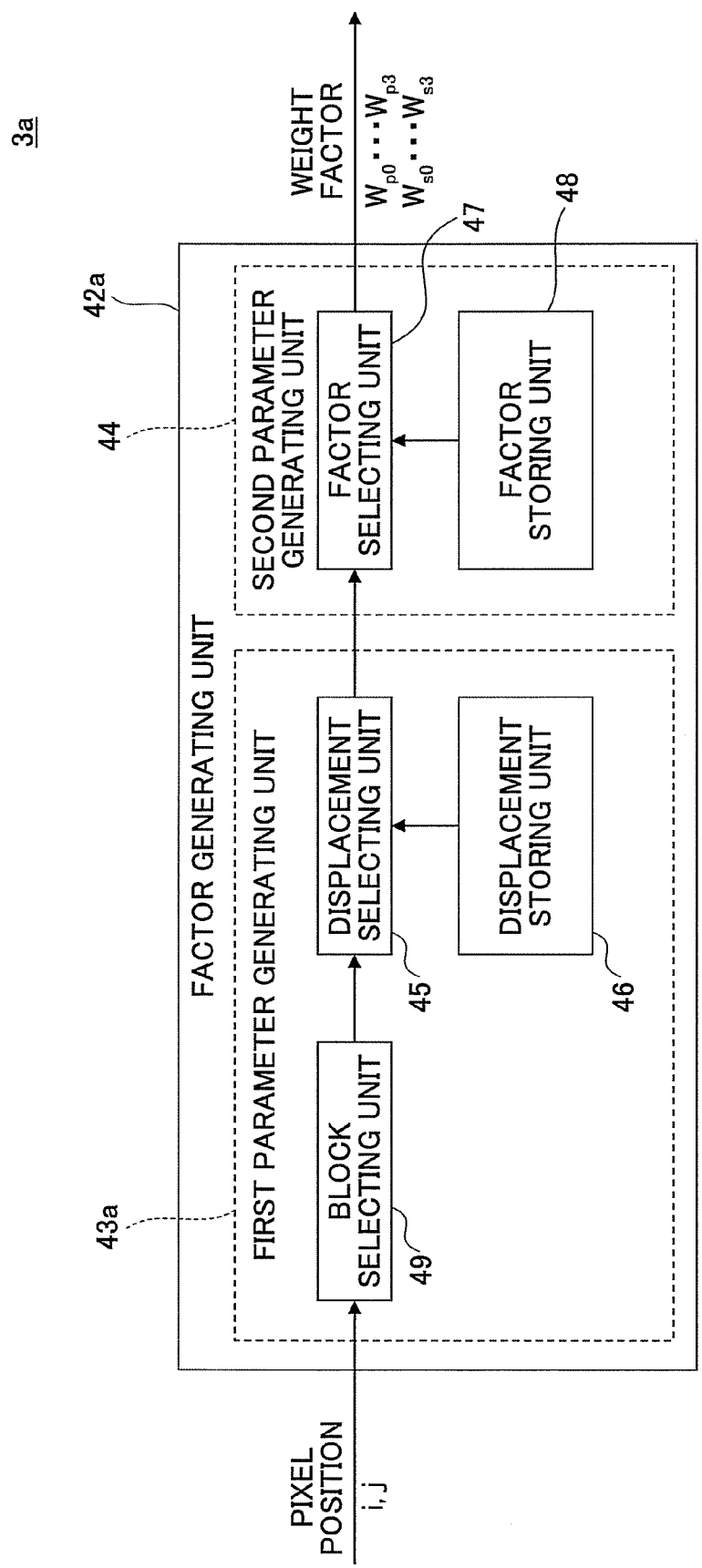
FIG. 17 is a block diagram illustrating the configuration of the first parameter generating unit provided in the signal processing unit of the imaging apparatus according to the second embodiment.

FIG. 17 is a block diagram illustrating the configuration of the first parameter generating unit provided in the signal processing unit of the imaging apparatus according to the present embodiment. FIG. 18 is an illustrative drawing illustrating a memory capacity for storing displacements on a light-receiving-device-specific basis.

The imaging apparatus according to the present embodiment differs from the imaging apparatus of the first embodiment in that the screen of the image sensor is divided into blocks, and weight factors are stored on a block-by-block basis.

In the imaging apparatus of the present embodiment, the light receiving device array 1 serving as an image sensor, the area-divided polarizing filter 2, the imaging optical system 2a, and the output interface unit 35 are the same as those of the first embodiment Further, the image generating unit 5 of a signal processing unit 3a and the pixel selecting unit 41 of the parameter generating unit 4 in the imaging apparatus of the present embodiment are the same as those of the first embodiment. Moreover, the second parameter generating unit 44 of a factor generating unit 42a provided in the parameter generating unit 4 of the signal processing unit 3a in the imaging apparatus of the present embodiment is the same as that of the first embodiment.

On the other hand, a first parameter generating unit 43a of the factor generating unit 42a provided in the parameter generating unit 4 of the signal processing unit 3a in the imaging apparatus of the present embodiment differs from the corresponding one of the first embodiment. The first parameter generating unit 43a includes a block selecting unit 49 for selecting a block comprised of a plurality of light receiving devices (i.e., pixels) in addition to the displacement selecting unit 45 and the displacement storing unit 46, which are the same as those of the first embodiment. The displacement storing unit 46 stores first parameters, one of which corresponds to the plurality of light receiving devices selected by the block selecting unit 49.

The displacement selecting unit 45 and the displacement storing unit 46 may be referred to as a selecting unit and a memory unit, respectively, in the disclosures herein.

In the present embodiment, a block having a block size of 8-x-8 pixels, for example, is used when the displacement storing unit 46 stores displacements. The coordinates (i, j) of a light receiving device are divided by 8, respectively, which is equal to the block size. Namely, the storage capacity for storing displacements is shifted to the right by three bits. In this manner, a block selecting signal can be generated to select a block that corresponds to the position (i, j) of the light receiving device (i.e., pixel).

Figure 18:
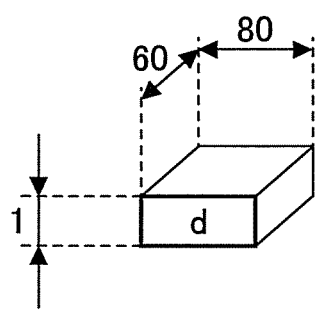
FIG. 18 is an illustrative drawing illustrating a memory capacity for storing displacements on a light-receiving-device-specific basis.

As illustrated in FIG. 18, a nonvolatile memory having a capacity of 4800 bytes (=80×60×1=(640/8)×(480/8)×1) is used as the displacement storing unit 46 to store displacements in the present embodiment. Accordingly, the memory volume required for the factor generating unit of the present embodiment is 6848 bytes (=(640/8)×(480/8)×1+256×4×2), which is about 0.3% of the memory volume (640×480×4×2=2457600 bytes) required in the comparative example illustrated in FIG. 16.

The imaging apparatus of the present embodiment described above utilizes the fact that weight factors remain unchanged when the position of the light transmissive section pattern relative to the light receiving device pattern is the same. Accordingly, the present embodiment which does not store the factors of all the light receiving devices (i.e., pixels) can still produce as satisfactory results as in the case in which the factors of all the light receiving devices are stored. Further, displacements are stored on an area-by-area basis, rather than on a pixel-by-pixel basis. With this arrangement, a yet smaller memory capacity is sufficient to store all the displacements.

Third Embodiment

In the following, a description will be given of an imaging apparatus according to a third embodiment by referring to FIG. 19.

Figure 19:
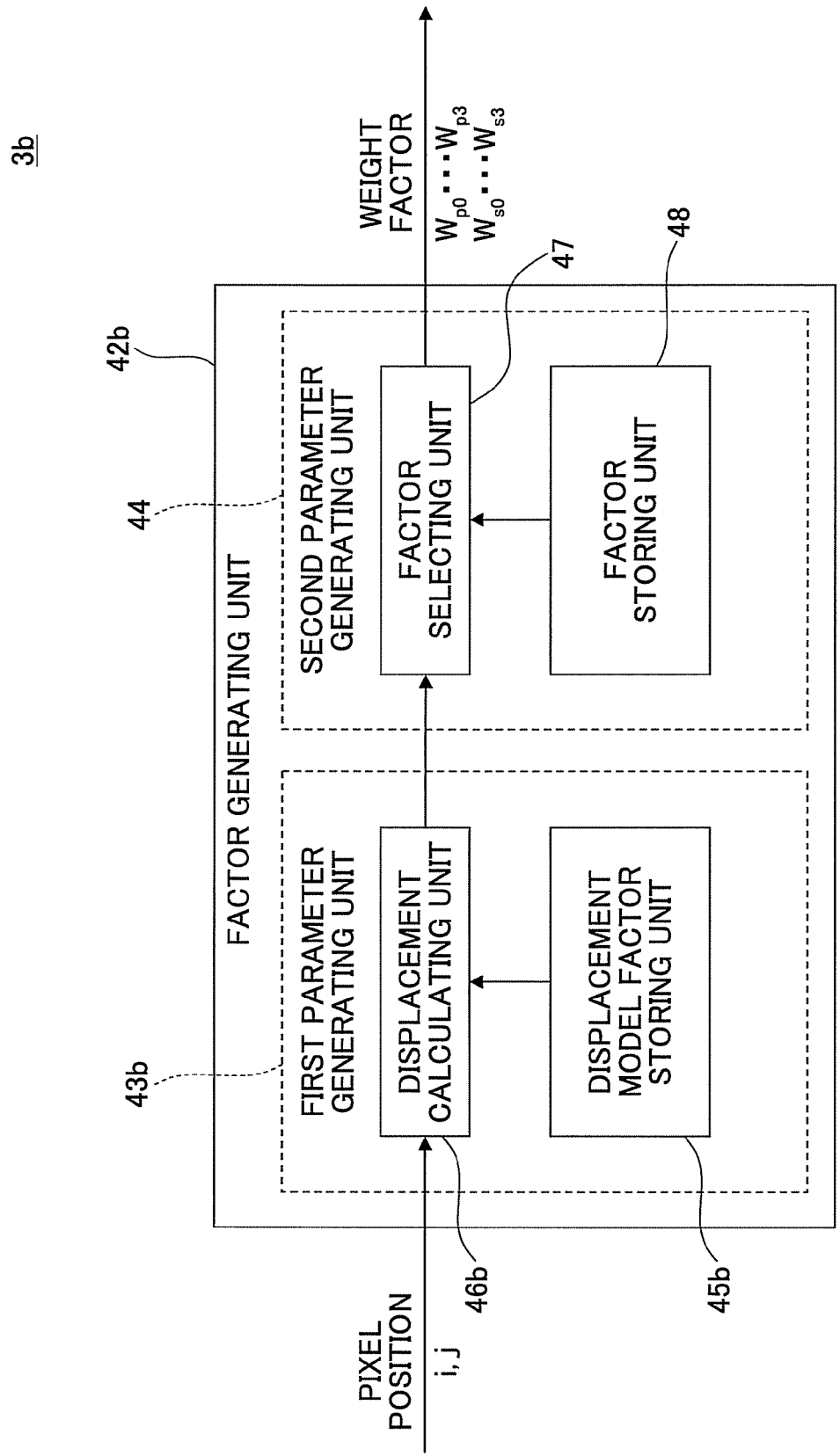
FIG. 19 is a block diagram illustrating the configuration of the first parameter generating unit provided in the signal processing unit of the imaging apparatus according to the third embodiment.

FIG. 19 is a block diagram illustrating the configuration of the first parameter generating unit provided in the signal processing unit of the imaging apparatus according to the present embodiment.

The imaging apparatus according to the present embodiment differs from the imaging apparatus of the first embodiment in that model factors representing a relational expression between first parameters and light receiving device positions are only stored.

The model factors may be referred to as third parameters in the disclosures herein.

In the imaging apparatus of the present embodiment, the light receiving device array 1 serving as an image sensor, the area-divided polarizing filter 2, the imaging optical system 2a, and the output interface unit 35 are the same as those of the first embodiment. Further, the image generating unit 5 of a signal processing unit 3b and the pixel selecting unit 41 of the parameter generating unit 4 in the imaging apparatus of the present embodiment are the same as those of the first embodiment. Moreover, the second parameter generating unit 44 of a factor generating unit 42b provided in the parameter generating unit 4 of the signal processing unit 3b in the imaging apparatus of the present embodiment is the same as that of the first embodiment.

On the other hand, a first parameter generating unit 43b of the factor generating unit 42b provided in the parameter generating unit 4 of the signal processing unit 3b in the imaging apparatus of the present embodiment differs from the corresponding one of the first embodiment. The first parameter generating unit 43b includes a displacement model factor storing unit 45b and a displacement calculating unit 46b. The displacement model factor storing unit 45b stores model factors that are parameters representing a relational expression between first parameters and the positions of light receiving devices. The displacement calculating unit 46b calculates a first parameter corresponding to the position of a light receiving device of interest by use of the model factors stored in the displacement model factor storing unit 45b.

The displacement model factor storing unit 45b and the displacement calculating unit 46b may be referred to as a memory unit and a calculating unit, respectively, in the disclosures herein.

In the present embodiment, the distribution of displacements $d_{i,j}$ described in connection with FIG. 12 in the first embodiment is approximated by a model. For example, the distribution is approximated by a flat plane as follows.

$$d = ax + by + c \quad (6)$$

In this case, the storing of three model factors a, b, and c is sufficient to calculate a displacement for each light receiving device (i.e., pixel). The model factors a, b, and c are stored in the displacement model factor storing unit 45b in advance.

In the present embodiment, further, the displacement calculating unit 46b calculates a flat-plane approximation expression as follows with respect to the pixel position (i, j), thereby obtaining the displacement $d_{i,j}$.

$$d = ai + bj + c \quad (7)$$

The imaging apparatus of the present embodiment described above utilizes the fact that weight factors remain unchanged when the position of the light transmissive section pattern relative to the light receiving device pattern is the same. Accordingly, the present embodiment which does not store the factors of all the light receiving devices (i.e., pixels) can still produce as satisfactory results as in the case in which the factors of all the light receiving devices are stored. Further, displacements are generated through calculations based on the coordinates of light receiving devices. With this arrangement, a yet smaller memory capacity is sufficient to obtain a displacement at the position of each light receiving device.

The signal processing methods of the three imaging apparatuses of the first through third respective embodiments may be referred to as (a) through (c). The storage capacities required in (a) through (c) are related as: (c)<(b)<(a). That is, the third embodiment is the most preferable. The degrees of data freedom in (a) through (c) are related as: (a)>(b)>(c). That is, the first embodiment is, the most preferable. When the cause of displacements is solely the rotation of the polarizing filter or a change in the pitch, the planar approximation of (c) is the most preferable. When the distribution of displacements cannot be approximated by a linear expression due to filter distortion or the like, higher accuracy is obtained by (a) and (b) than by (c). In this case, (a) and (b) are more preferable. Accordingly, one of (a) through (c) may be selected in response to the distribution of actual displacements, constraints on memory capacity, etc.

Moreover, various reference images may be obtained in step S11 by changing imaging conditions such as zoom, aperture, etc. Various parameters inclusive of weight factors may then be calculated in accordance with these conditions, and may be stored in memory for subsequent use.

According to at least one embodiment, an imaging apparatus reconstructs the image signals of light receiving devices through matrix processing, and does not need to store all the factors of light receiving devices (i.e., pixels) in memory to perform as satisfactory correction as when all these factors are stored.

Further, the present invention is not limited to these embodiments, but various variations and modifications may be made without departing from the scope of the present invention.

The above-noted embodiments have been described with reference to a case in which an area-divided polarizing filter is used as a light transmissive filter. In place of the area-divided polarizing filter, a color filter may be used in the imaging apparatus of the present invention. This color filter may include spectral filters having different light transmission wavelength bands disposed in a predetermined arrangement pattern as in the case of a color separation filter (i.e., area-divided spectral filter), in which areas are divided into R (red), G (green), and B (blue). In this case, the light receiving device array can produce color image data.

The present application is based on Japanese priority application No. 2009-248135 filed on Oct. 28, 2009, with the Japanese Patent Office, the entire contents of which are hereby incorporated by reference.

What is claimed is:

1. An imaging apparatus, comprising:
    a light receiving device array having light receiving devices two-dimensionally arranged in both a row direction and a column direction;
    a light transmissive filter disposed in front of the light receiving device array, the light transmissive filter including plural types of band-shape light transmissive sections having respective, different light transmissive characteristics, and the plural types of band-shape light transmissive sections being arranged in sequence so that a direction perpendicular to a border line between the light transmissive sections is parallel to neither the row direction nor the column direction of the light receiving device array to form a light transmissive section pattern; and
    an arithmetic processing unit configured to perform arithmetic processing on image data output from the light receiving devices,
    wherein the arithmetic processing unit includes:
    a first parameter generating unit configured to generate a first parameter indicative of a displacement of the light transmissive section pattern relative to the light receiving device array in response to a position of one of the light receiving devices;
    a second parameter generating unit configured to generate second parameters in response to the first parameter generated by the first parameter generating unit; and
    an image generating unit configured to produce output images in response to image signals output from the light receiving devices and the second parameters generated by the second parameter generating unit.

2. The imaging apparatus as claimed in claim 1, wherein the first parameter has sub-pixel accuracy.

3. The imaging apparatus as claimed in claim 1, wherein the first parameter indicates, in a vicinity of the one of the light receiving devices, a position of the light transmissive section pattern relative to a light receiving device pattern in which the light receiving devices are arranged, and the second parameters are weight factors for determining image signals of the one of the light receiving devices based on the image signals output from the light receiving devices, and wherein the image generating unit generates the output images by calculating a weighted sum of the image signals output from the light receiving devices by using the second parameters.

4. The imaging apparatus as claimed in claim 1, wherein the first parameter generating unit includes:
- a memory unit configured to store first parameters on a light-receiving-device-specific basis; and
- a selecting unit configured to select and retrieve the first parameter corresponding to the position of the one of the light receiving devices.

5. The imaging apparatus as claimed in claim 1, wherein the first parameter generating unit includes:
- a memory unit configured to store first parameters each corresponding to a plurality of light receiving devices; and
- a selecting unit configured to select and retrieve the first parameter corresponding to the position of the one of the light receiving devices.

6. The imaging apparatus as claimed in claim 1, wherein the first parameter generating unit includes:
- a memory unit configured to store third parameters representing a relational expression between positions of the light receiving devices and first parameters; and
- a calculating unit configured to calculate the first parameter corresponding to the position of the one of the light receiving devices by use of the third parameters stored in the memory unit.

* * * * *